(12) United States Patent
Bussiere et al.

(10) Patent No.: US 11,574,830 B2
(45) Date of Patent: Feb. 7, 2023

(54) SUBSTRATE TRANSPORT APPARATUS

(71) Applicant: Brooks Automation, Inc., Chelmsford, MA (US)

(72) Inventors: Christopher A. Bussiere, Groton, MA (US); Blake R Tashjian, Somerville, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 935 days.

(21) Appl. No.: 16/354,954

(22) Filed: Mar. 15, 2019

(65) Prior Publication Data

US 2019/0287833 A1     Sep. 19, 2019

Related U.S. Application Data

(60) Provisional application No. 62/644,053, filed on Mar. 16, 2018.

(51) Int. Cl.
| | | |
|---|---|---|
| *B25J 9/16* | (2006.01) | |
| *H01L 21/677* | (2006.01) | |
| *B25J 9/04* | (2006.01) | |
| *B25J 9/10* | (2006.01) | |
| *H01L 21/67* | (2006.01) | |

(52) U.S. Cl.
CPC ......... *H01L 21/67706* (2013.01); *B25J 9/04* (2013.01); *B25J 9/108* (2013.01); *B25J 9/1664* (2013.01); *H01L 21/67161* (2013.01); *H01L 21/67167* (2013.01); *H01L 21/67173* (2013.01); *H01L 21/67196* (2013.01); *H01L 21/67742* (2013.01)

(58) Field of Classification Search
CPC ................................. B25J 9/10; H01L 21/677
See application file for complete search history.

(56) References Cited

U.S. PATENT DOCUMENTS

| | | |
|---|---|---|
| 2,452,458 A | 10/1948 | Hahn |
| 3,160,429 A | 12/1964 | Martins |
| 3,561,614 A | 2/1971 | Tezuka et al. |

(Continued)

FOREIGN PATENT DOCUMENTS

| | | |
|---|---|---|
| EP | 0423608 | 4/1991 |
| TW | 201233511 | 8/2012 |
| TW | 201314828 | 4/2013 |

OTHER PUBLICATIONS

International Search Report for International Application No. PCT/US2019/22768, dated Jul. 24, 2019.

(Continued)

*Primary Examiner* — Kira Nguyen
(74) *Attorney, Agent, or Firm* — Perman & Green, LLP; Colin C. Durham

(57) ABSTRACT

A substrate transport apparatus including, a torsional motion driver member having an exterior perimeter circumscribing an axis of rotation of the torsional motion driver member, and a torsional motion follower member including a body portion and a bearing collar rotatably coupled to the body portion, the torsional motion follower member being coupled to the torsional motion driver member with a dimensionally substantially invariant interface, wherein the bearing collar is decoupled from the exterior perimeter of the torsional motion driver member so that the exterior perimeter, as a whole, is free of the bearing collar.

28 Claims, 26 Drawing Sheets

(56) References Cited

U.S. PATENT DOCUMENTS

| | | |
|---|---|---|
| 4,864,888 A | 9/1989 | Iwata |
| 5,536,106 A | 7/1996 | Landis et al. |
| 6,682,432 B1 | 1/2004 | Shinozuka |
| 6,902,347 B2 | 6/2005 | Stolz et al. |
| 7,524,132 B2 | 4/2009 | Horen et al. |
| 8,070,375 B2 | 12/2011 | Moore |
| 8,449,215 B2 | 5/2013 | Lissy |
| 8,951,130 B2 | 2/2015 | Neufelder |
| 9,517,558 B2 | 12/2016 | Krishnasamy et al. |
| 2004/0096270 A1 | 5/2004 | Brandemuehl |
| 2006/0039781 A1 | 2/2006 | Niewmierzycki et al. |
| 2008/0119294 A1 | 5/2008 | Erikson et al. |
| 2008/0317548 A1 | 12/2008 | Pettey |
| 2012/0148375 A1* | 6/2012 | Tashiro ............... H01L 21/6719 414/217 |
| 2012/0321434 A1 | 12/2012 | Laceky et al. |
| 2013/0068060 A1 | 3/2013 | Xu et al. |
| 2013/0183131 A1 | 7/2013 | Blank et al. |
| 2014/0348618 A1 | 11/2014 | Blank |
| 2015/0190933 A1 | 7/2015 | Kremerman |
| 2015/0206782 A1 | 7/2015 | Caveney et al. |
| 2016/0238048 A1 | 8/2016 | Halabi |
| 2016/0351425 A1* | 12/2016 | Kim ................. H01L 21/67766 |
| 2018/0010728 A1 | 1/2018 | Shannahan et al. |
| 2018/0182628 A1* | 6/2018 | Um .................. H01L 21/67173 |
| 2018/0373154 A1* | 12/2018 | Choi ................. H01L 21/0274 |

OTHER PUBLICATIONS

Supplementary European Search Report Application No. PCT/US2019022768.

* cited by examiner

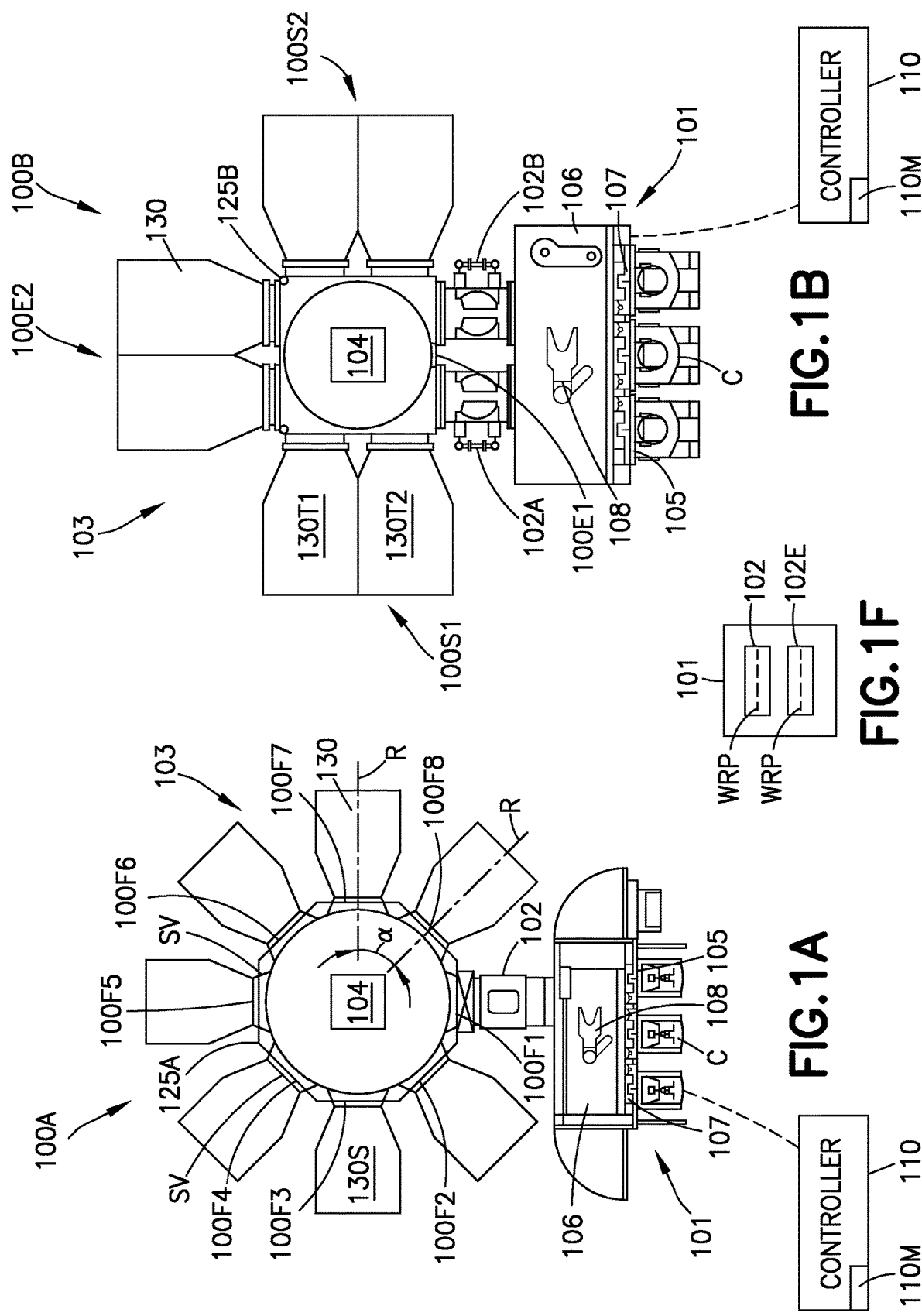

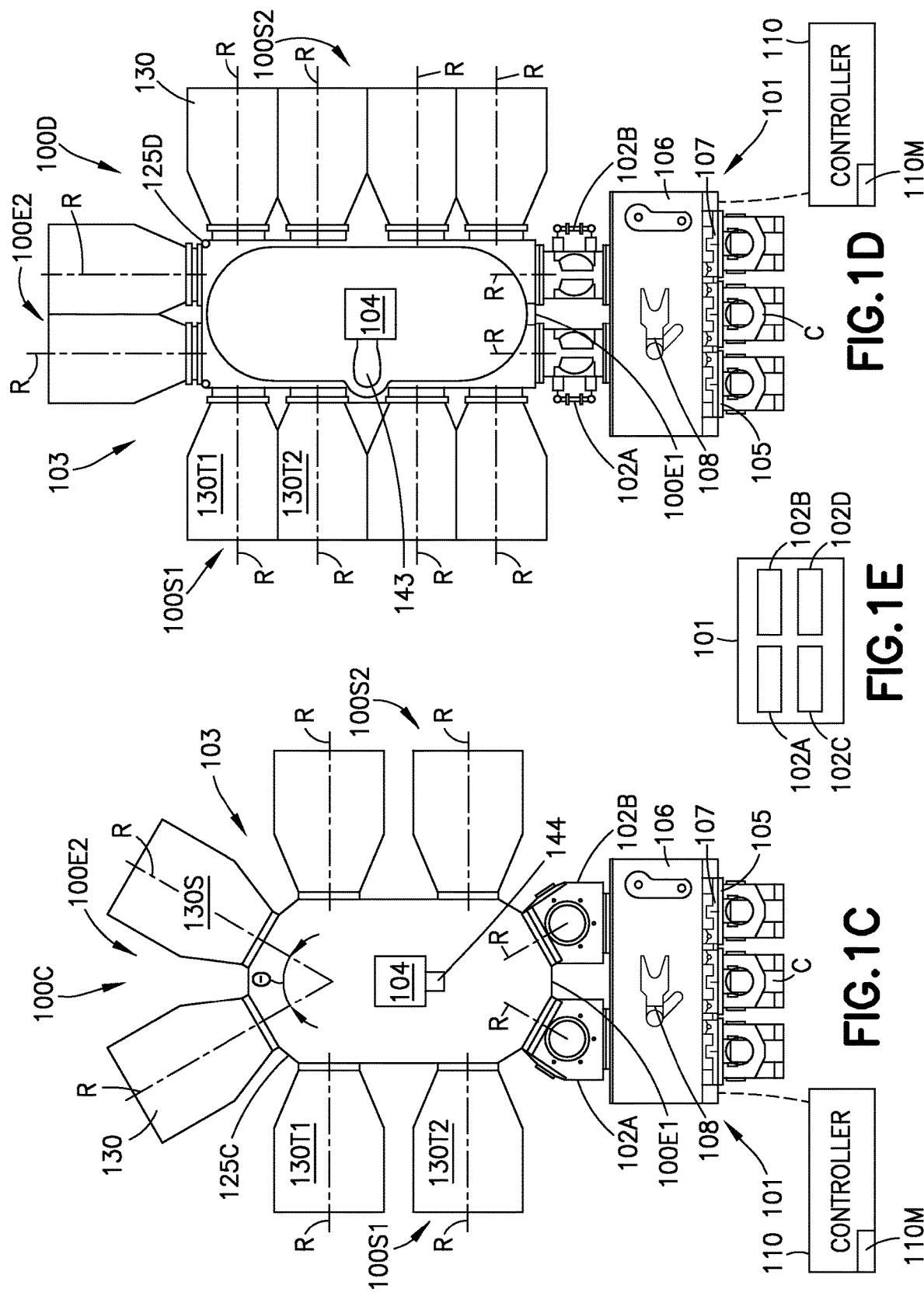

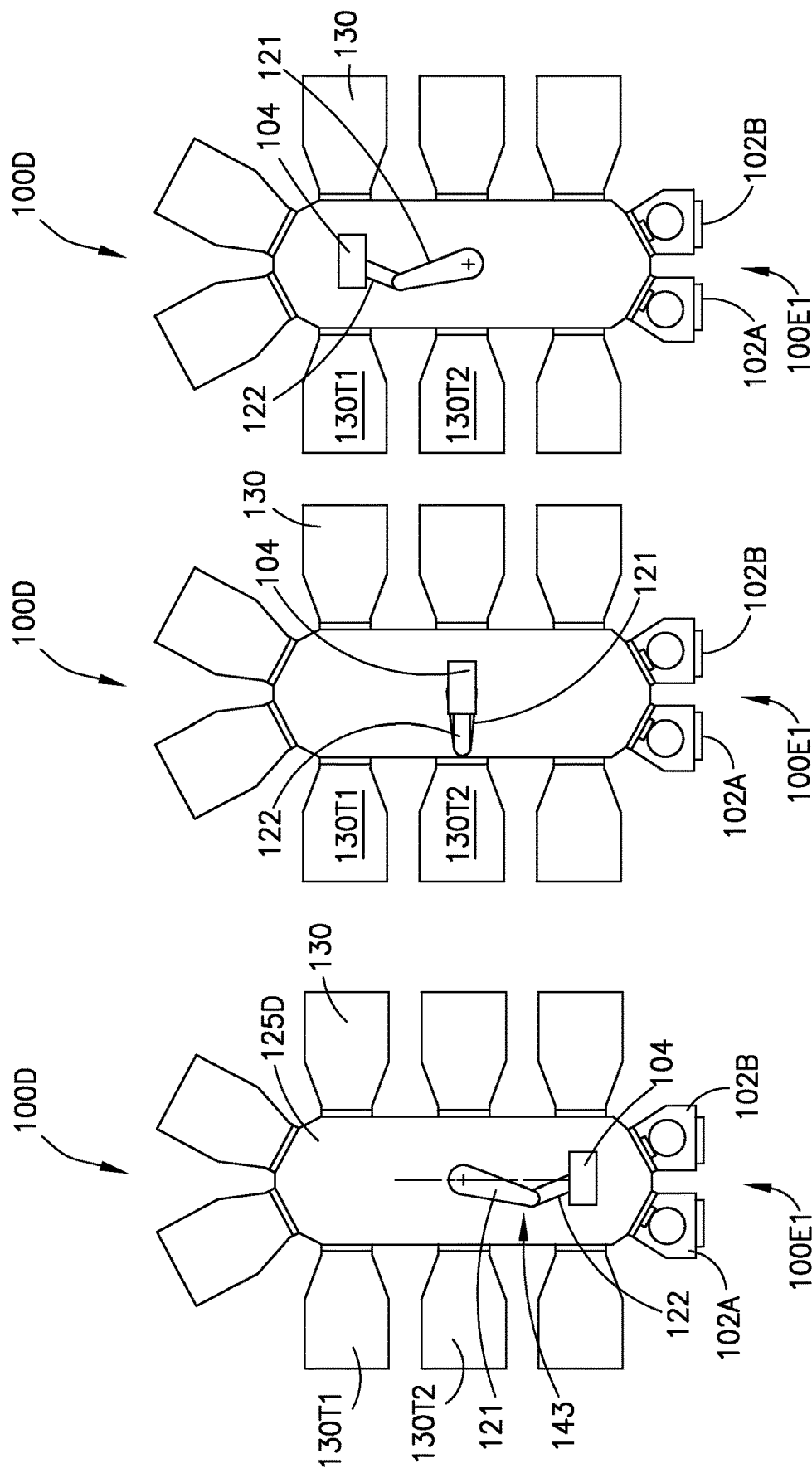

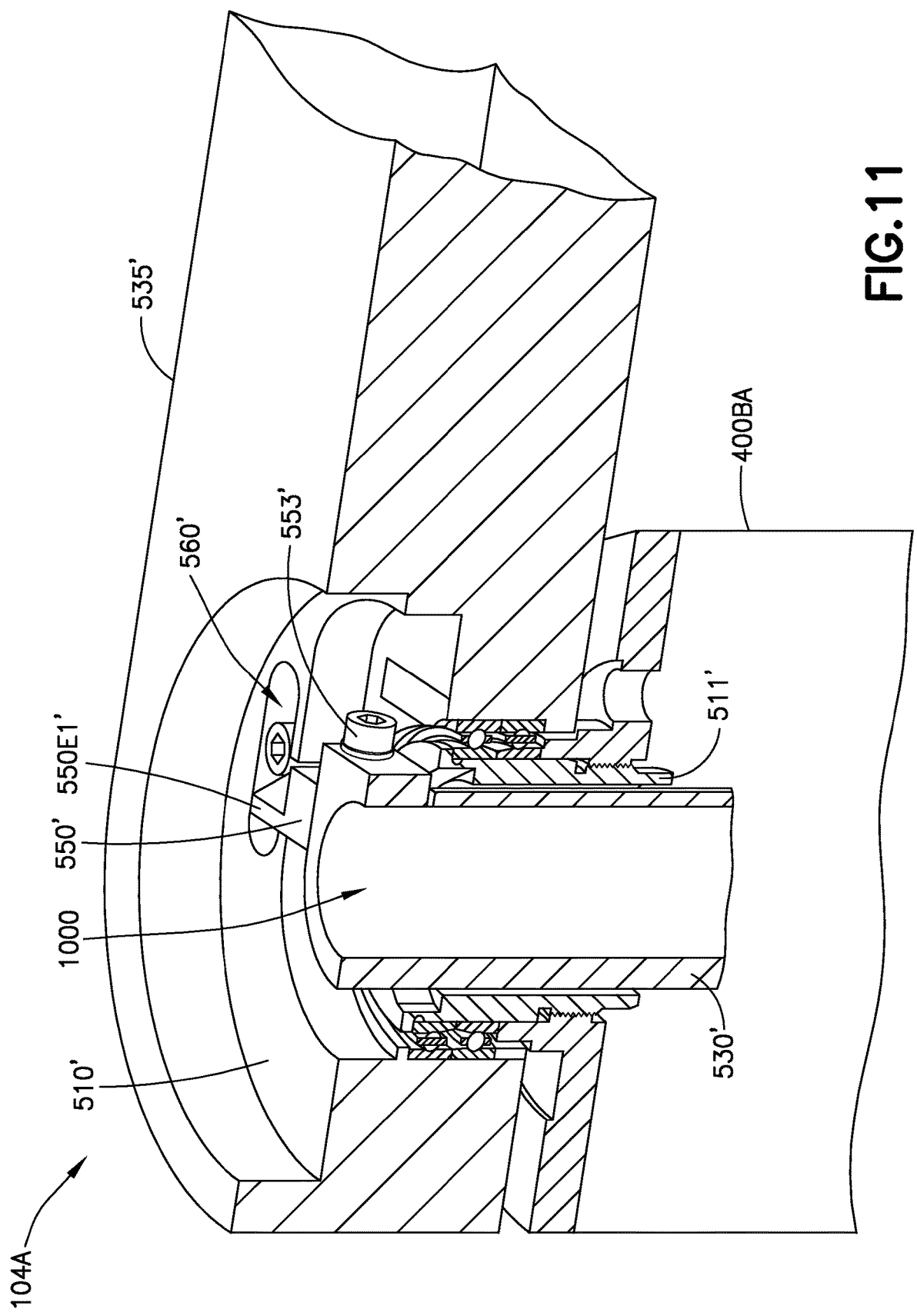

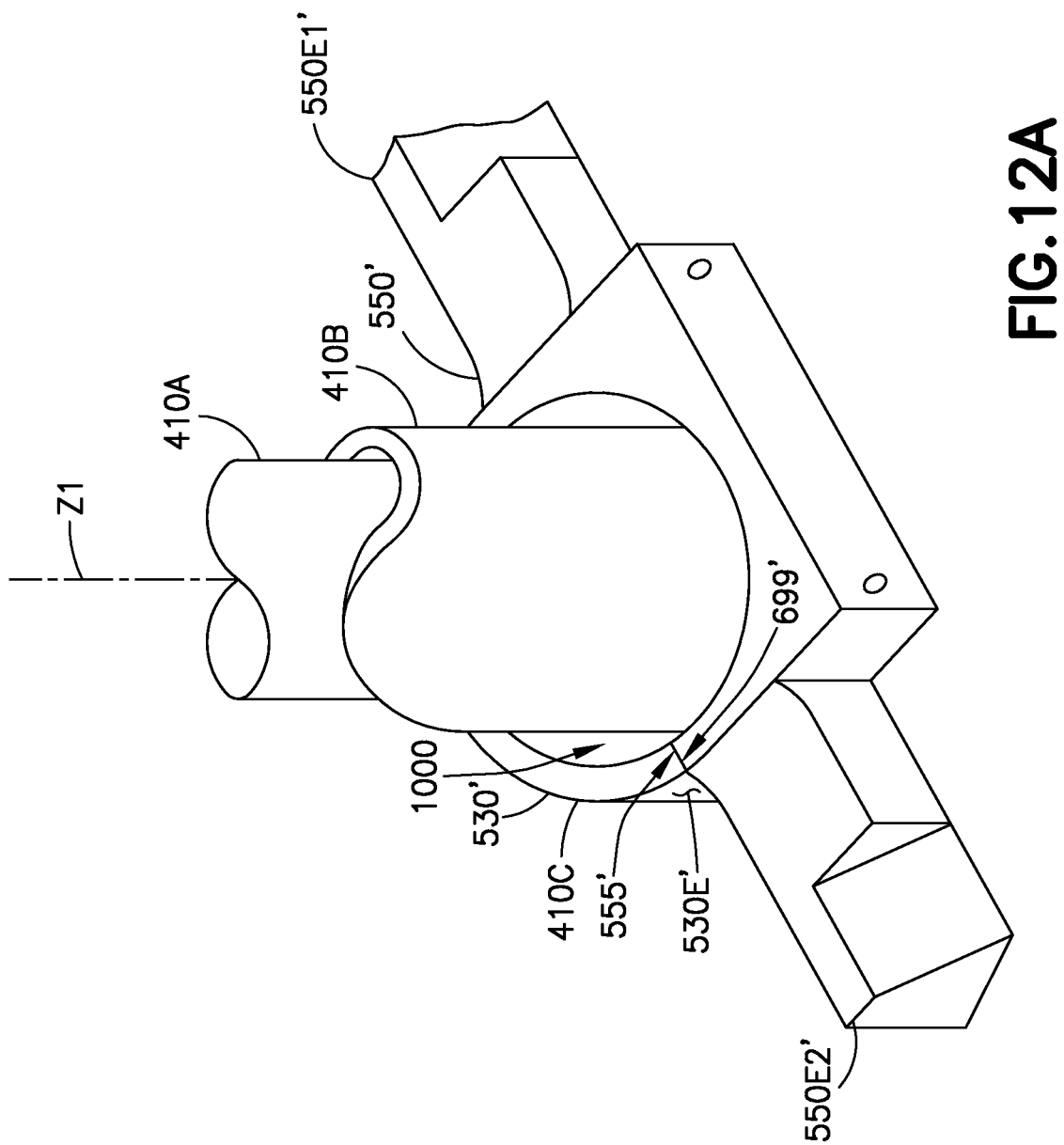

SUBSTRATE TRANSPORT APPARATUS

CROSS REFERENCE TO RELATED APPLICATIONS

This application is a non-provisional of, and claims the benefit of, U.S. Provisional Patent Application No. 62/644,053 filed on Mar. 16, 2018, the disclosure of which is incorporated herein by reference in its entirety.

BACKGROUND

1. Field

The exemplary embodiments generally relate to automated processing equipment, and more particularly, to substrate transport apparatus.

2. Brief Description of Related Developments

Generally, in semiconductor processing substrates are placed at processing locations in predetermined positions. The substrates are placed at the predetermined positions by substrate transport apparatus. These substrate transport apparatus are configured with drive systems (e.g., motors, pulleys, belts, bands, etc.) that allow for repeatable placement of the substrates at the predetermined positions. For example, conventional substrate transport apparatus are generally placing substrate with about a 100 μm repeatability. However, as technology advances and features on the substrate become increasingly complex the placement accuracy of conventional substrate transport apparatus may not be sufficient to repeatedly place substrate in the processing positions with a desired accuracy that corresponds to the increasingly complex features.

It would be advantageous to provide a substrate transport with substantially invariant, rigid torque couplings connecting an end effector of the substrate transport with a drive to, for example, substantially limit an impact of motor hysteresis between the drive and the arm linkage.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of substrate processing apparatus in accordance with aspects of the disclosed embodiment;

FIGS. 1E and 1F are schematic illustrations of portions of the substrate processing apparatus of FIGS. 1A-1D in accordance with aspects of the disclosed embodiment;

FIGS. 1G-1M are schematic illustrations of substrate processing apparatus in accordance with aspects of the disclosed embodiment;

FIG. 11 is a partial cross section elevation schematic illustration of a portion of the substrate transport apparatus illustrated in FIG. 10 in accordance with aspects of the disclosed embodiment; and FIGS. 12A-12B are schematic illustrations of portions of the substrate transport apparatus illustrated in FIGS. 5 and 10 in accordance with aspects of the disclosed embodiment.

DETAILED DESCRIPTION

FIGS. 1A-1M are schematic illustrations of substrate processing apparatus in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Figure 4:
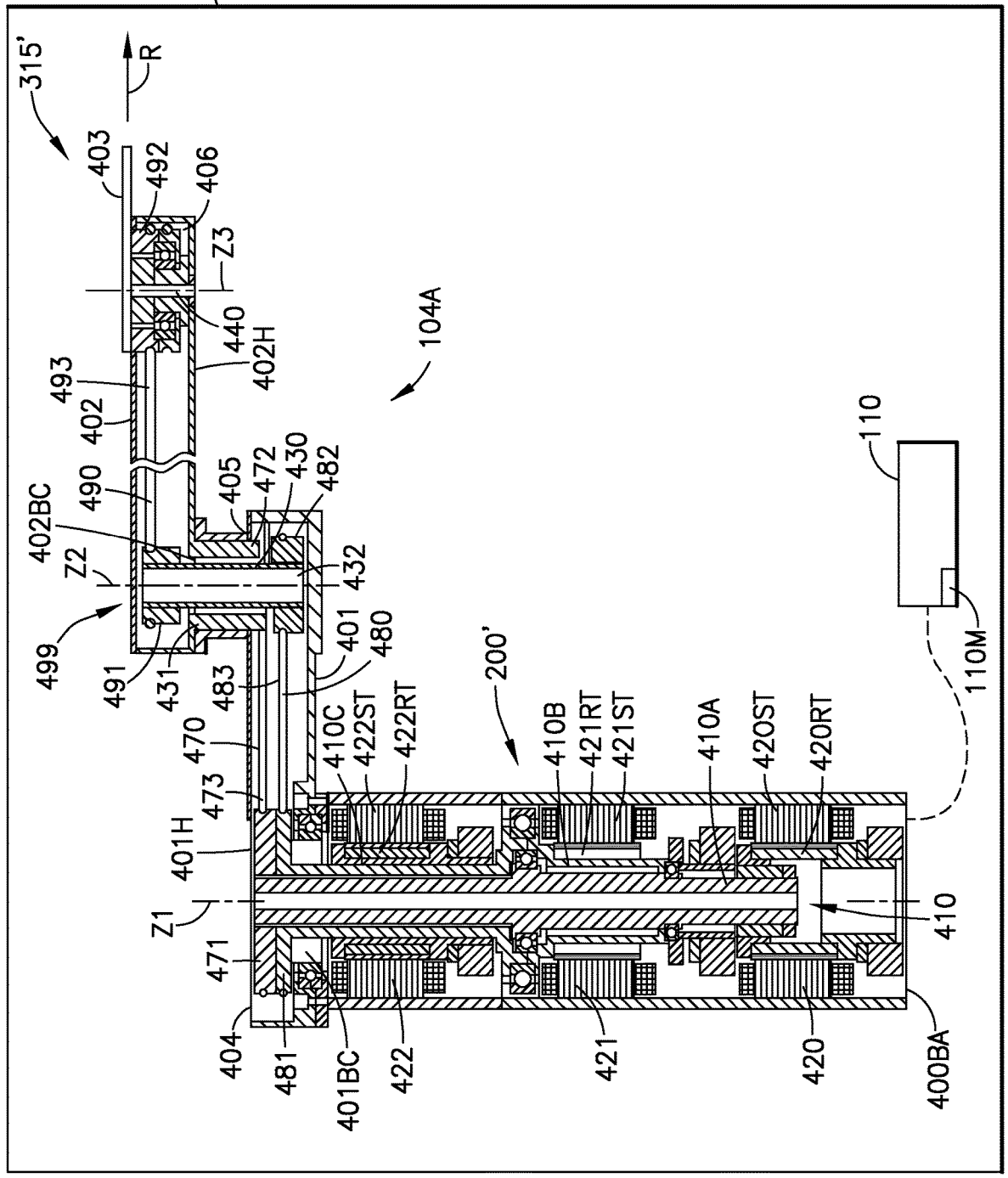
FIG. 4 is schematic illustrations of a substrate transport apparatus in accordance with aspects of the disclosed embodiment.

The aspects of the disclosed embodiment provide for methods and apparatus that effect high precision motion of a substrate transport apparatus 104A (FIG. 4). The high precision motion is motion that provides the substrate transport apparatus 104A with improved repeatability of placement of substrates over known substrate transport apparatus and, in some specific instances, repeatability of placement of substrates better than about 100 microns, such that an end effector of the substrate transport apparatus 104A, and substrate carried thereon, repeatably extends along a wafer transport plane to place (or pick) the substrate. For example, as will be described in greater detail below, the aspects of the disclosed embodiment provide for the substrate transport apparatus 104A to include a dimensionally substantially invariant interface 500 (FIG. 5) at the torque couplings of the substrate transport apparatus 104A. The dimensionally substantially invariant interface 500 substantially increases the repeatability and accuracy of the substrate transport apparatus 104A placing the substrate by, for example, substantially eliminating friction couplings (and the inconsistent or unrepeatable variance inherent thereto) within the drive system that may be affected (inconsistently) by environmental or other operating conditions of the substrate transport apparatus 104A.

In conventional substrate transport apparatus, variability in the robot performance caused by, e.g., thermal effects, such as expansion and contraction, wear of robot components, robot component shift, motor hysteresis, etc., may be a source of repeatability errors in, for example, the placement and picking of substrates S from, e.g., processing station 130. For example, the robot arm may undergo thermal expansion and contraction (among other thermal effects and/or other variabilities) as it is subjected to temperature variations during processing. These temperature variations effect the positioning of the robot arm, such that a centered position (e.g., a predetermined substrate hold position) of the end effector is offset or has a positional variance $\Delta_{PV}$. In order to reduce these variabilities of, e.g., the transport arm 315' (FIG. 4) and increase the repeatability and accuracy, the couplings between a rotary driver member and a rotary follower member of the substrate transport apparatus 104A (e.g., torque couplings) of the transport arm 315' may be coupled with a dimensionally substantially invariant interface 500 (FIG. 5) that provides repeatability, by virtue of its substantially invariant interface through the full range of arm motion (along all paths and trajectories including optimal trajectories with applications of max motor, or rated motor τ with "bang-bang" control). A suitable example of arm motion range and trajectory is described in U.S. Pat. No. 9,517,558, entitled "TIME-OPTIMAL TRAJECTORIES FOR ROBOTIC TRANSFER DEVICES," issued Dec. 13, 2016 (the disclosure of which is incorporated herein by reference in its entirety), though the disclosed embodiment is applicable to any suitable trajectory. As will be described further below, the dimensionally substantially invariant interface 500 is a rigid, substantially non-slip interface to effect torque transfer of the total torque (for and across all torque transients during arm motion control), between the rotary drive member and the rotary follower member, via a substantially non-friction torque transfer.

Figure 1J:
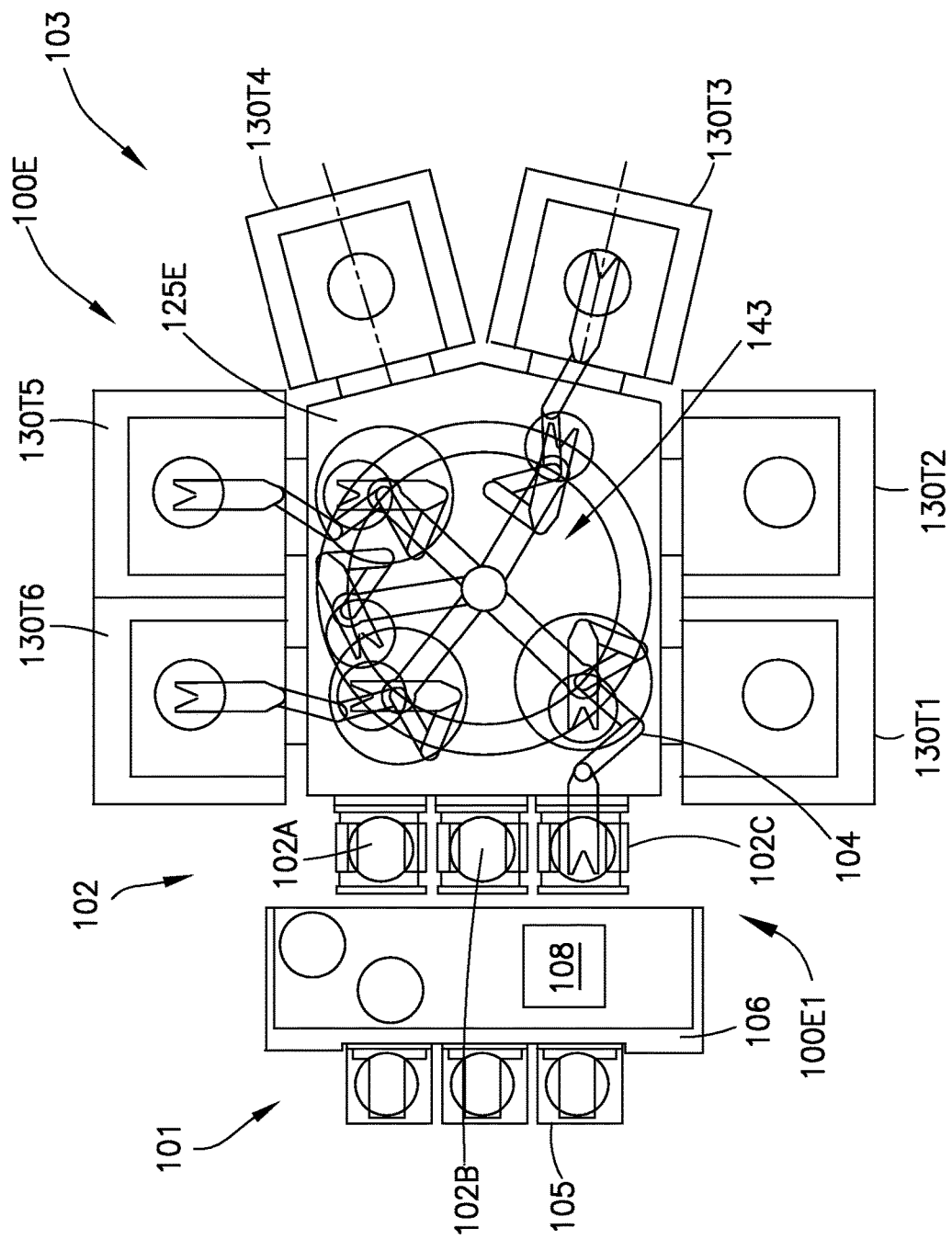
Figure 1K:
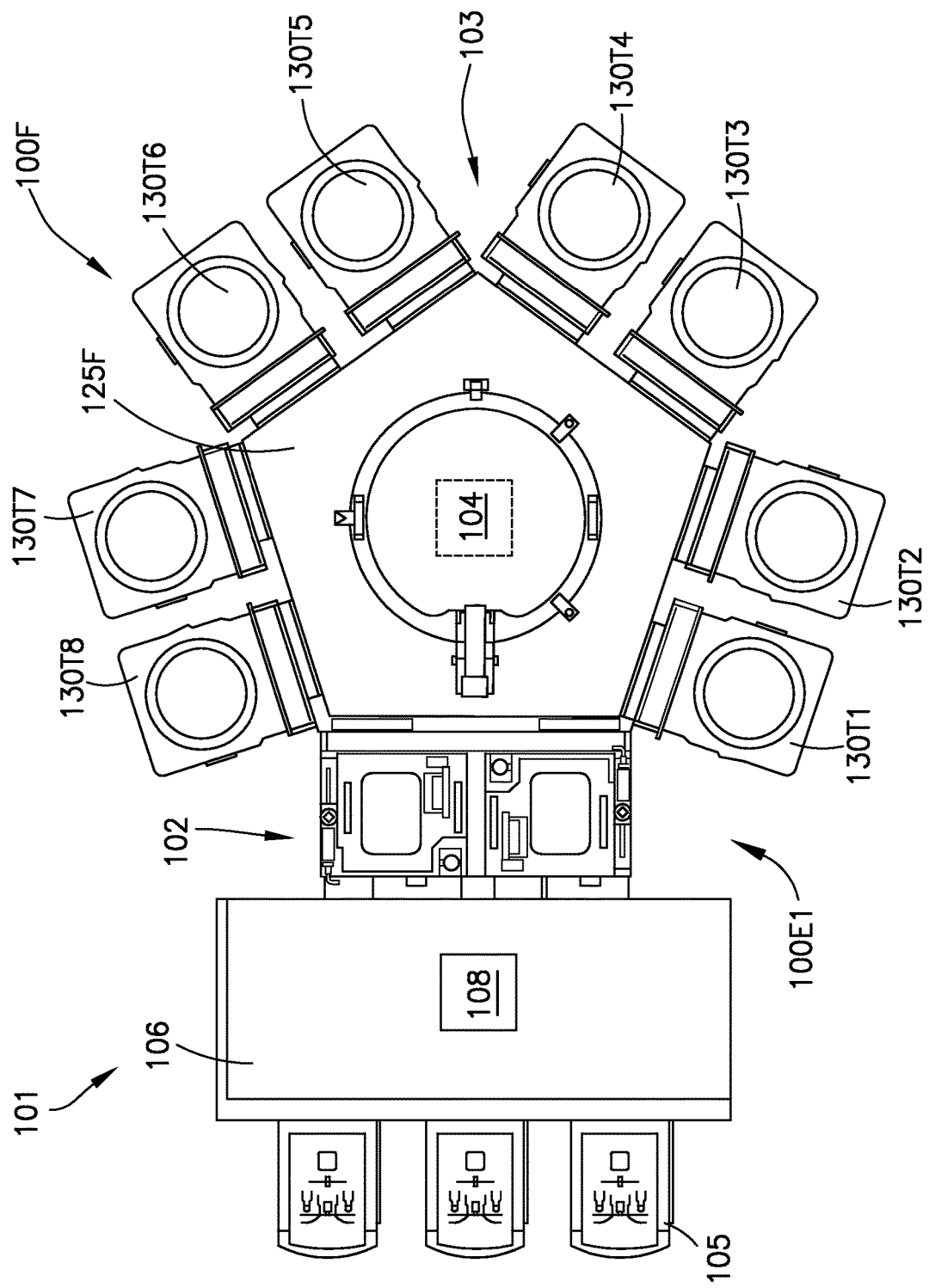

The processing apparatus 100A, 100B, 100C, 100D, 100E, 100F, 100G, 100H such as for example a semiconductor tool station, is shown in accordance with aspects of the disclosed embodiment. Although a semiconductor tool station is shown in the drawings, the aspects of the disclosed embodiment described herein can be applied to any tool station or application employing torque couplings. In one aspect the processing apparatus 100A, 100B, 100C, 100D, 100E, 100F, 100G, 100H, 100I are shown as having cluster tool arrangements (e.g., having substrate holding stations connected to a central chamber) while in other aspects the processing apparatus may be a linearly arranged tool 100L, 100M, as described in U.S. Pat. No. 8,398,355, entitled "Linearly Distributed Semiconductor Workpiece Processing Tool," issued Mar. 19, 2013 (the disclosure of which is incorporated herein by reference in its entirety); however the aspects of the disclosed embodiment may be applied to any suitable tool station. The apparatus 100A, 100B, 100C, 100D, 100E, 100F, 100G, 100H, 100I generally include an atmospheric front end 101, at least one vacuum load lock 102, 102A, 102B, 102C and a vacuum back end 103. The at least one vacuum load lock 102, 102A, 102B, 102C may be coupled to any suitable port(s) or opening(s) of the front end 101 and/or back end 103 in any suitable arrangement. For example, in one aspect the one or more load locks 102, 102A, 102B, 102C may be arranged in a common horizontal plane in a side by side arrangement as can be seen in FIGS. 1B-1D and 1G-1K. In other aspects the one or more load locks may be arranged in a grid format such that at least two load locks 102A, 102B, 102C, 102D are arranged in rows (e.g., having spaced apart horizontal planes) and columns (e.g., having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D, 125E, 125F in other aspects the one or more load lock may be arranged on any number of sides 100S1, 100S2, ends 100E1, 100E2 or facets 100F1-100F8 of the transport chamber 125A, 125B, 125C, 125D, 125E, 125F. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B, 102C and back end 103 may be connected to a controller 110 which may be part of any suitable control architecture such as, for example, a clustered architecture control. The control system may be a closed loop controller having a master controller (which in one aspect may be controller 110), cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, 1J and 1K, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B, 102C may be located between and connected to the mini-environment 106 and the back end 103. In other aspects the load ports 105 may be coupled substantially directly to the at least one load lock 102, 102A, 102B, 102C or the transport chamber 125A, 125B, 125C, 125D, 125E, 125F where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock or otherwise have access to the carrier C for transferring substrates to and from the substrate carrier C. It is noted that the term vacuum as used herein may denote a high vacuum such as $10^{-5}$ Torr or below in which the substrates are processed. The at least one load lock 102, 102A, 102B, 102C generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D, 100E, 100F (as well as linear processing apparatus 100G, 100H) may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B, 102C coupled to the transport chamber 125A, 125B, 125C, 125D, 125E, 125F. The at least one load lock 102, 102A, 102B, 102C (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, 125E, 125F one or more processing station(s) or module(s) 130 and any suitable number of substrate transport apparatus 104 that includes one or more transport robots which may include one or more aspects of the disclosed embodiments described herein. The transport chamber 125A, 125B, 125C, 125D, 125E, 125F may have any suitable shape and size that, for example, complies with SEMI standard E72 guidelines. The substrate transport apparatus 104 and the one or more transport robot will be described below and may be located at least partly within the transport chamber 125A, 125B, 125C, 125D, 125E, 125F to transport substrates between the load lock 102, 102A, 102B, 120C (or between a cassette C located at a load port) and the various processing stations 130. In one aspect the substrate transport apparatus 104 may be removable from the transport chamber 125A, 125B, 125C, 125D, 125E, 125F as modular unit such that the substrate transport apparatus 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125A, 125B, 125C, 125D, 125E, 125F in any suitable manner, such as through slot valves SV, to allow substrates to be passed from the transport chamber 125A, 125B, 125C, 125D, 125E, 125F to the processing stations 130 and vice versa. The slot valves SV of the transport chamber 125A, 125B, 125C, 125D, 125E, 125F may be arranged to allow for the connection of twin (e.g., more than one substrate processing chamber located within a common housing) or side-by-side process stations 130T1-130T8, single process stations 130S and/or stacked process modules/load locks (FIGS. 1E and 1F). As further described below, the substrate transport apparatus effects the repeatability and accuracy throughout the range and variance of temperatures and pressures/vacuum that the substrate transport apparatus is subjected to corresponding to processes within the respective processing apparatus.

It is noted that the transfer of substrates to and from the processing station 130, load locks 102, 102A, 102B, 102C (or cassette C) coupled to the transfer chamber 125A, 125B, 125C, 125D, 125E, 125F may occur when one or more arms of the substrate transport apparatus 104 are aligned with a predetermined processing station 130 along an axis of extension and retraction R of the substrate transport apparatus 104. In accordance with aspects of the disclosed embodiment one or more substrates may be transferred to a respective predetermined processing station 130 individually or substantially simultaneously (e.g., such as when substrates are picked/placed from side-by-side or tandem processing stations as shown in FIGS. 1B, 1C, 1D and 1G-1K. In one aspect the substrate transport apparatus 104 may be mounted on a boom arm 143 (see e.g., FIGS. 1D and 1G-1I), where the boom arm 143 has a single boom link or multiple boom links 121, 122, or linear carriage 144 such as that described in U.S. provisional patent application Nos. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 1L:
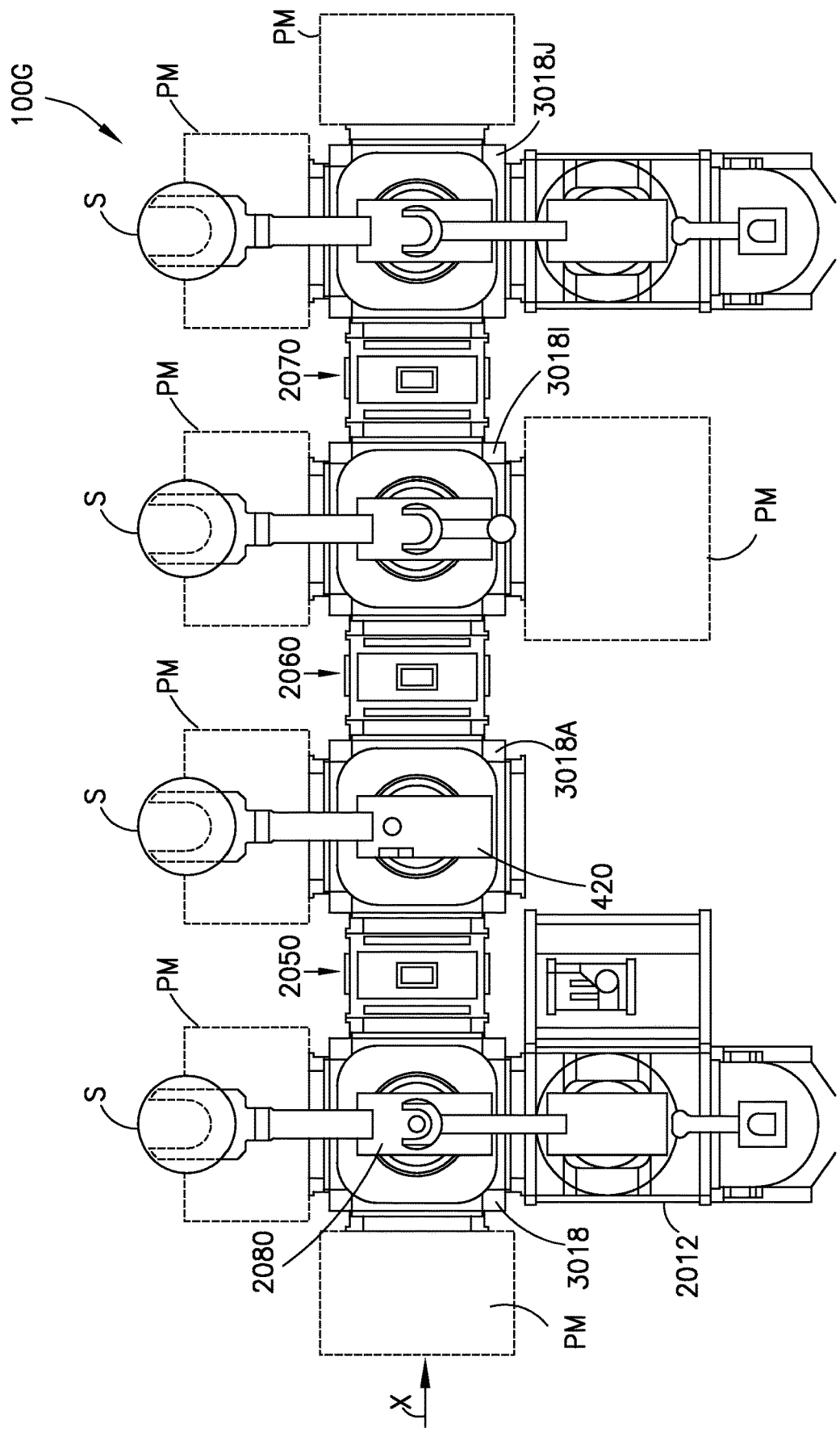

Referring now to FIG. 1L, a schematic plan view of a linear wafer processing system 100G is shown where the tool interface section 2012 is mounted to a transport chamber module 3018 so that the interface section 2012 is facing generally towards (e.g., inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3018A, 3018I, 3018J includes any suitable wafer transport 2080, which may include one or more aspects of the disclosed embodiment described herein, for transporting wafers throughout the processing system 100G and into and out of, for example, processing modules PM. As may be realized, each chamber module may be capable of holding an isolated or controlled atmosphere (e.g., N2, clean air, vacuum).

Figure 1M:
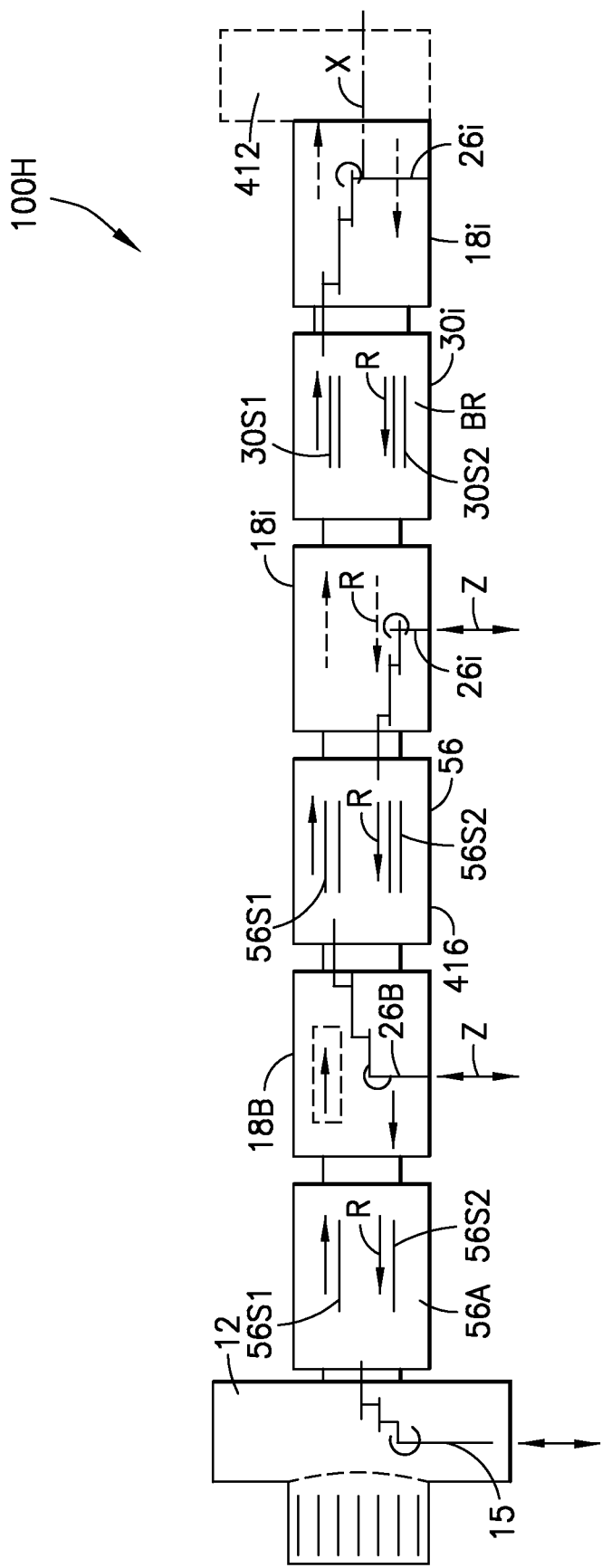

Referring to FIG. 1M, there is shown a schematic elevation view of an exemplary processing tool 100H such as may be taken along longitudinal axis X of the linear transport chamber 416. In the aspect of the disclosed embodiment shown in FIG. 1M, tool interface section 12 may be representatively connected to the transport chamber 416. In this aspect, interface section 12 may define one end of the tool transport chamber 416. As seen in FIG. 1M, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g., N2, clean air, vacuum). As noted before, the configuration/arrangement of the transport chamber modules 18B, 18i, load lock modules 56A, 56 and workpiece stations forming the transport chamber 416 shown in FIG. 1M is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

As also noted before, transport chamber modules 18B, 18i have one or more corresponding substrate transport apparatus 26B, 26i, which may include one or more aspects of the disclosed embodiment described herein, located therein. The substrate transport apparatus 26B, 26i of the respective transport chamber modules 18B, 18i may cooperate to provide the linearly distributed workpiece transport system 420 in the transport chamber. In this aspect, the substrate transport apparatus 26B may have a general SCARA arm configuration (though in other aspects the transport arms may have any other desired arrangement as described below).

In the aspect of the disclosed embodiment shown in FIG. 1M, the arms and/or end effectors of the transport apparatus 26B may be arranged to provide what may be referred to as fast swap arrangement allowing the transport to quickly swap wafers from a pick/place location. The substrate transport apparatus 26B may have any suitable drive section (e.g., coaxially arranged drive shafts, side by side drive shafts, horizontally adjacent motors, vertically stacked motors, etc.), for providing each arm with any suitable number of degrees of freedom (e.g., independent rotation about shoulder and elbow joints with Z axis motion). As seen in FIG. 1M, in this aspect the modules 56A, 56, 30i may be located interstitially between transfer chamber modules 18B, 18i and define suitable processing modules, load lock(s), buffer station(s), metrology station(s) or any other desired station(s). For example the interstitial modules, such as load locks 56A, 56 and workpiece station 30i, each have stationary workpiece supports/shelves 56S1, 56S2, 30S1, 30S2 that cooperate with the substrate transport apparatus to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the substrate transport apparatus 15 of the interface section. The workpiece(s), in load lock module 56A, may be moved between load lock module 56A and load lock module 56 by the substrate transport apparatus 26B in module 18B, and in a similar and consecutive manner between load lock 56 and workpiece station 30i with substrate transport apparatus 26i (in module 18i) and between station 30i and station 412 with substrate transport apparatus 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, substrate transport apparatus of adjoining transport chamber modules may pass off workpieces directly from one end effector or one transport arm to an end effector or transport arm of another substrate transport apparatus to move the workpiece through the transport chamber. The processing station modules may operate on the wafers through various deposition, etching, or other types of processes to form electrical circuitry or other desired structure on the wafers. The processing station modules are connected to the transport chamber modules to allow wafers to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Referring now to FIGS. 2A, 2B, 2C, 2D in one aspect the substrate transport apparatus 104 includes at least one drive section 200, 200A, 200B, 200C and at least one robot arm, such as robot arms 314, 315, 316, 317, 318 described below. It is noted that the substrate transport apparatus 104 illustrated is exemplary and in other aspects may have any suitable configuration substantially similar to that described in U.S. application Ser. No. 14/568,742 entitled "Substrate transport apparatus" and filed on Dec. 12, 2014, the disclosure of which is incorporated by reference herein in its entirety. One or more robot arms 314, 315, 316, 317, 318 may be coupled to respective drive shafts of one of drive sections 200, 200A-200C as described herein, at any suitable connection CNX so that the rotation of the drive shaft(s) effect movement of the respective transport arm(s) 314, 315, 316, 317, 318. As will be described below, in one aspect, the transport arms 314, 315, 316, 317, 318 are interchangeable from a number of different interchangeable transport arms 314, 315, 316, 317, 318 so as to be swapped one transport arm for another transport arm at the connection CNX with the drive section.

Figure 2A:
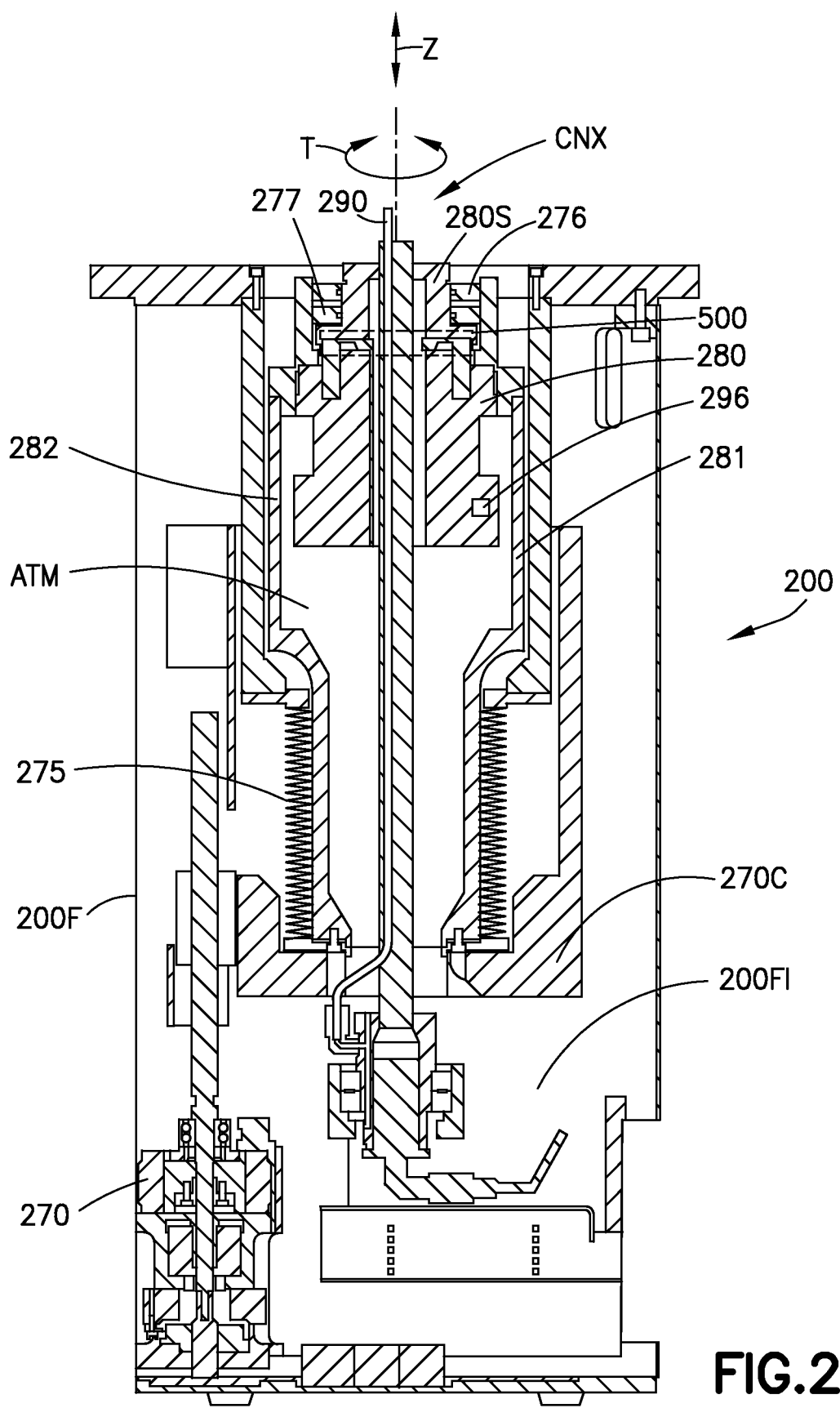
FIGS. 2A-2D are schematic illustrations of portions of substrate transport drive sections in accordance with aspects of the disclosed embodiment.
Figure 2B:
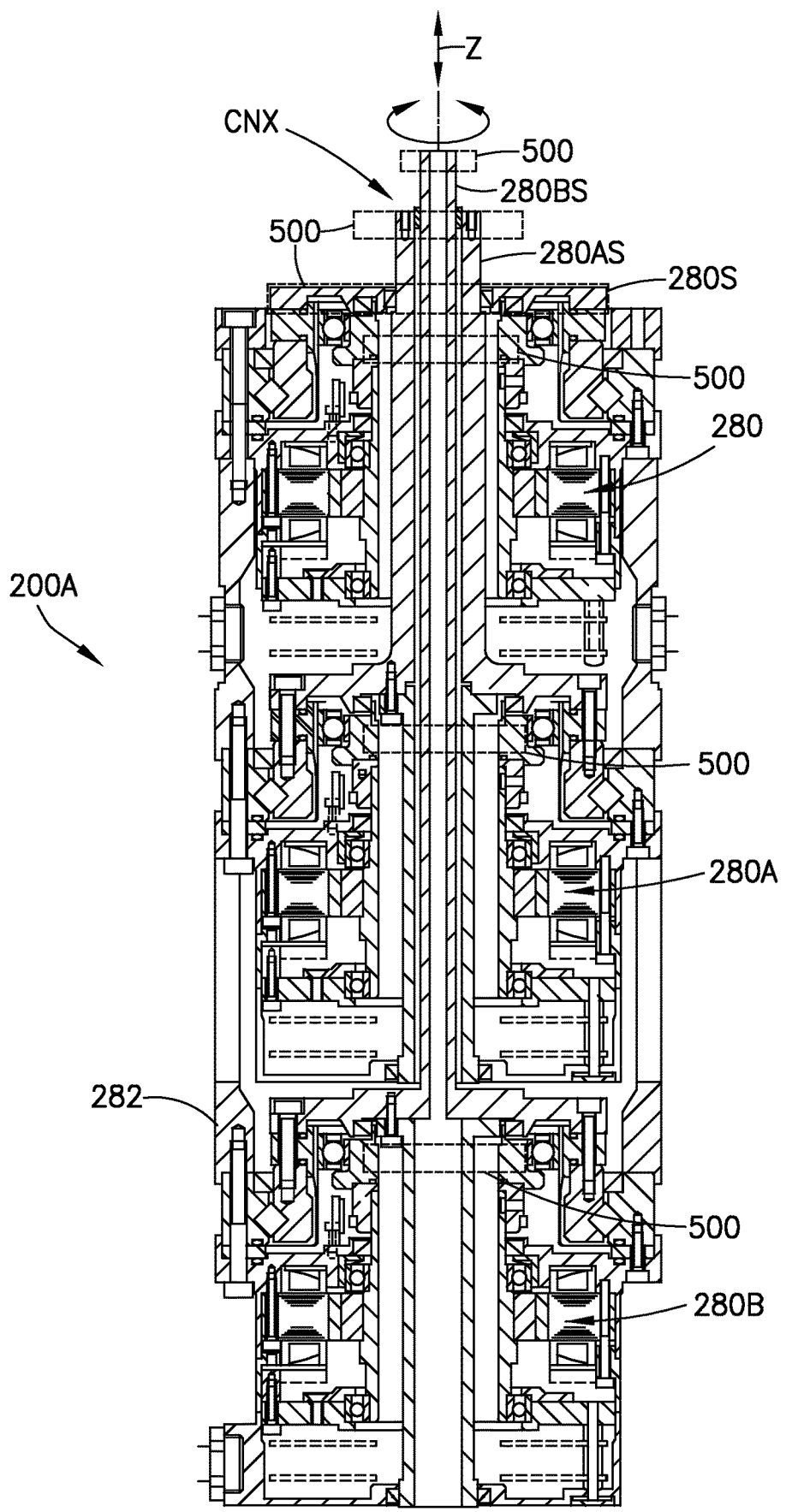

The at least one drive section 200, 200A, 200B, 200C is mounted to any suitable frame of the processing apparatus 100A-100H. In one aspect, as noted above, the substrate transport apparatus 104 may be mounted to a linear slide 144 or boom arm 143 (noting the boom arm may also include one or more aspects of the present disclosure as described herein) in any suitable manner where the linear slide and/or boom arm 143 has a drive section substantially similar to drive section 200, 200A, 200B, 200C described herein. The at least one drive section 200, 200A, 200B, 200C may include a common drive section that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the transport arms 314, 315, 316, 317, 318 along the Z axis. The Z axis drive is illustrated in FIG. 2A as a screw type drive but in other aspects the drive may be any suitable linear drive such as a linear actuator, piezo motor, etc. The rotational drive section 282 may be configured as any suitable drive section such as, for example, a harmonic drive section. For example, the rotational drive section 282 may include any suitable number of coaxially arranged harmonic drive motors 280, such as can be seen in FIG. 2B where the drive section 282 includes, for example, three coaxially arranged harmonic drive motors 280, 280A, 280B. In other aspects the drives of drive section 282 may be located side-by-side and/or in a coaxial arrangement. In one aspect the rotational drive section 282 shown in FIG. 2A includes one harmonic drive motor 280 for driving shaft 280S however, in other aspects the drive section may include any suitable number of harmonic drive motors 280, 280A, 280B (FIG. 2B) corresponding to, for example, any suitable number of drive shafts 280S, 280AS, 280BS (FIG. 2B) in the coaxial drive system.

The harmonic drive motor 280 may have high capacity output bearings such that the component pieces of a ferrofluidic seal 276, 277, are centered and supported at least in part by the harmonic drive motor 280 with sufficient stability and clearance during desired rotation T and extension R movements of the substrate transport apparatus 104. It is noted that the ferrofluidic seal 276, 277 may include several parts that form a substantially concentric coaxial seal as will be described below. In this example the rotational drive section 282 includes a housing 281 that houses one or more drive motor 280 which may be substantially similar to that described above and/or in U.S. Pat. Nos. 6,845,250; 5,899, 658; 5,813,823; and 5,720,590, the disclosures of which are incorporated by reference herein in their entireties. The ferrofluidic seal 276, 277 can be toleranced to seal each drive shaft 280S, 280AS, 280BS in the drive shaft assembly. In one aspect a ferrofluidic seal may not be provided. For example, the drive section 282 may include drives having stators that are substantially sealed from the environment in which the transport arms operate while the rotors and drive shafts share the environment in which the arms operate. Suitable examples, of drive sections that do not have ferrofluidic seals and may be employed in the aspects of the disclosed embodiment include the MagnaTran® 7 and MagnaTran® 8 robot drive sections from Brooks Automation, Inc. which may have a sealed can arrangement as will be described below. It is noted that drive shaft(s) 280S, 280AS, 280BS may also have a hollow construction (e.g., have a hole running longitudinally along a center of the drive shaft) to allow for the passage of wires 290 or any other suitable items through the drive assembly for connection to, for example, another drive section as described in U.S. patent application Ser. No. 15/110,130 filed on Jul. 7, 2016 and published as US 2016/0325440 on Nov. 10, 2016, the disclosure of which is incorporated herein by reference in its entirety, any suitable position encoders, controllers, and/or the at least one transfer arm 314, 315, 316, 317, 318, mounted to the drive section 200, 200A, 200B, 200C. As may be realized, each of the drive motors of drive section 200, 200A, 200B, 200C may include any suitable encoders configured to detect a position of the respective motor for determining a position of the end effector 314E, 315E, 316E, 317E1, 317E1, 318E1, 318E2 of each transport arm 314, 315, 316, 317, 318.

In one aspect the housing 281 may be mounted to a carriage 270C which is coupled to the Z axis drive 270 such that the Z axis drive 270 moves the carriage (and the housing 281 located thereon) along the Z axis. As may be realized, to seal the controlled atmosphere in which the transport arms 314, 315, 316, 317, 318 operates from the interior 200FI of the drive section 200, 200A, 200B, 200C (which may operate in an atmospheric pressure ATM environment), the drive section 200, 200A, 200B, 200C may include one or more of the ferrofluidic seal 276, 277 described above and a bellows seal 275. The bellows seal 275 may have one end coupled to the carriage 270C and another end coupled to any suitable portion of the frame 200F so that the interior 200FI of the frame 200F is isolated from the controlled atmosphere in which the transport arms 314, 315, 316, 317, 318 operates.

Figure 2C:
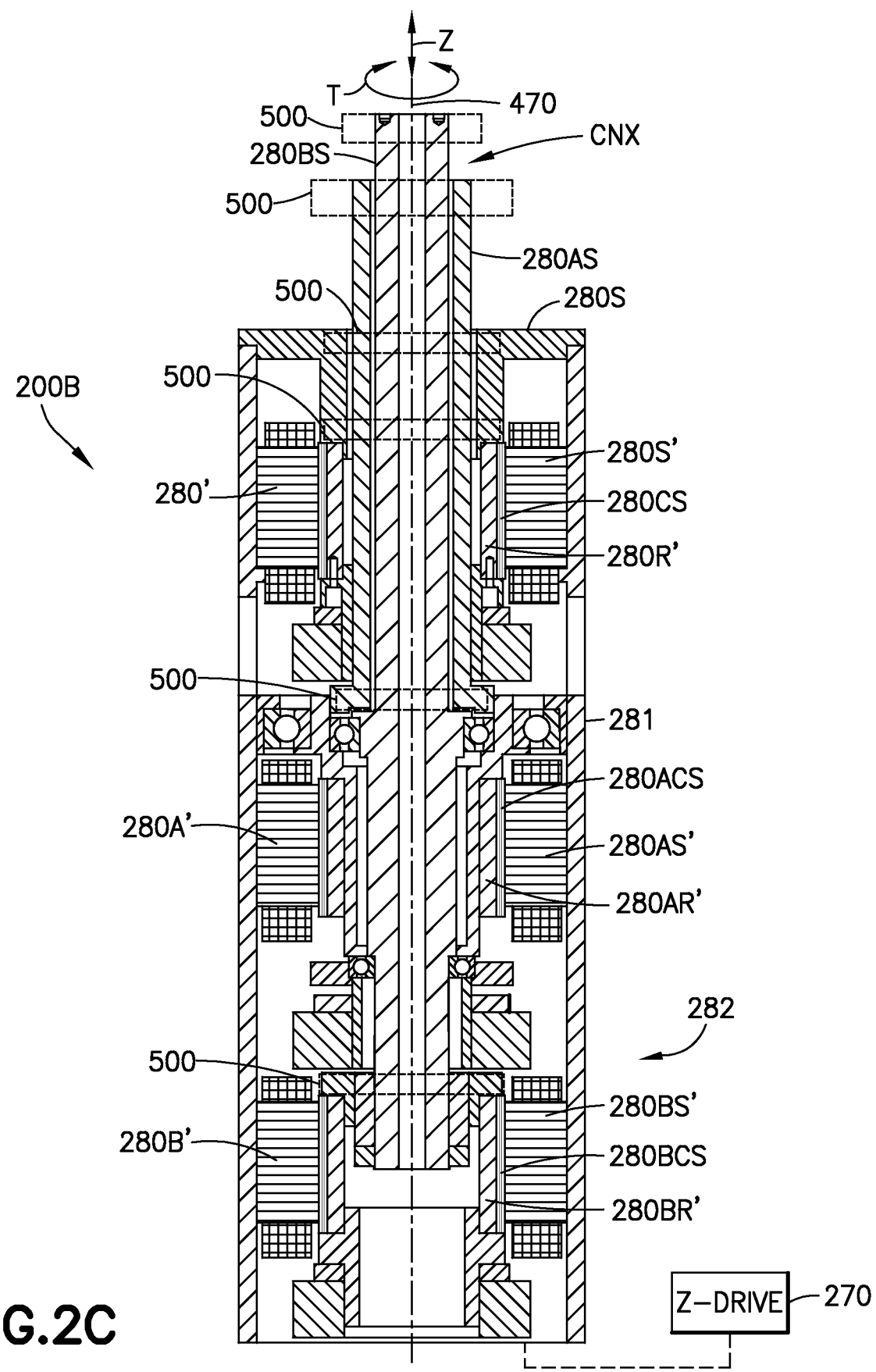

In other aspects, as noted above, a drive having stators that are sealed from the atmosphere in which the transport arms operate without a ferrofluidic seal, such as the MagnaTran® 7 and MagnaTran® 8 robot drive sections from Brooks Automation, Inc., may be provided on the carriage 270C. For example, referring also to FIGS. 2C and 2D the rotational drive section 282 is configured so that the motor stators are sealed from the environment in which the transport arms operate while the motor rotors share the environment in which the transport arms operate. Referring to FIG. 2C a tri-axial rotational drive section 282 is illustrated. In this aspect there are three motors 280', 280A', 280B', each having a rotor 280R', 280AR', 280BR' coupled to a respective drive shaft 280A, 280AS, 280BS. Each motor 280', 280A', 280B' also includes a respective stator 280S', 280AS', 280BS' which may be sealed from the atmosphere in which the transport arm(s) operate by a respective can seal 280SC, 280ACS, 280BCS. As may be realized any suitable encoders/sensors may be provided for determining a position of the drive shaft (and the arm(s) which the drive shaft(s) operates). As may be realized, in one aspect the drive shafts of the motors illustrated in FIG. 2C may not allow for wire 290 feed-through while in other aspects any suitable seals may be provided so that wires may be passed through, for example, hollow drive shafts of the motors illustrated in FIG. 2C.

Figure 2D:
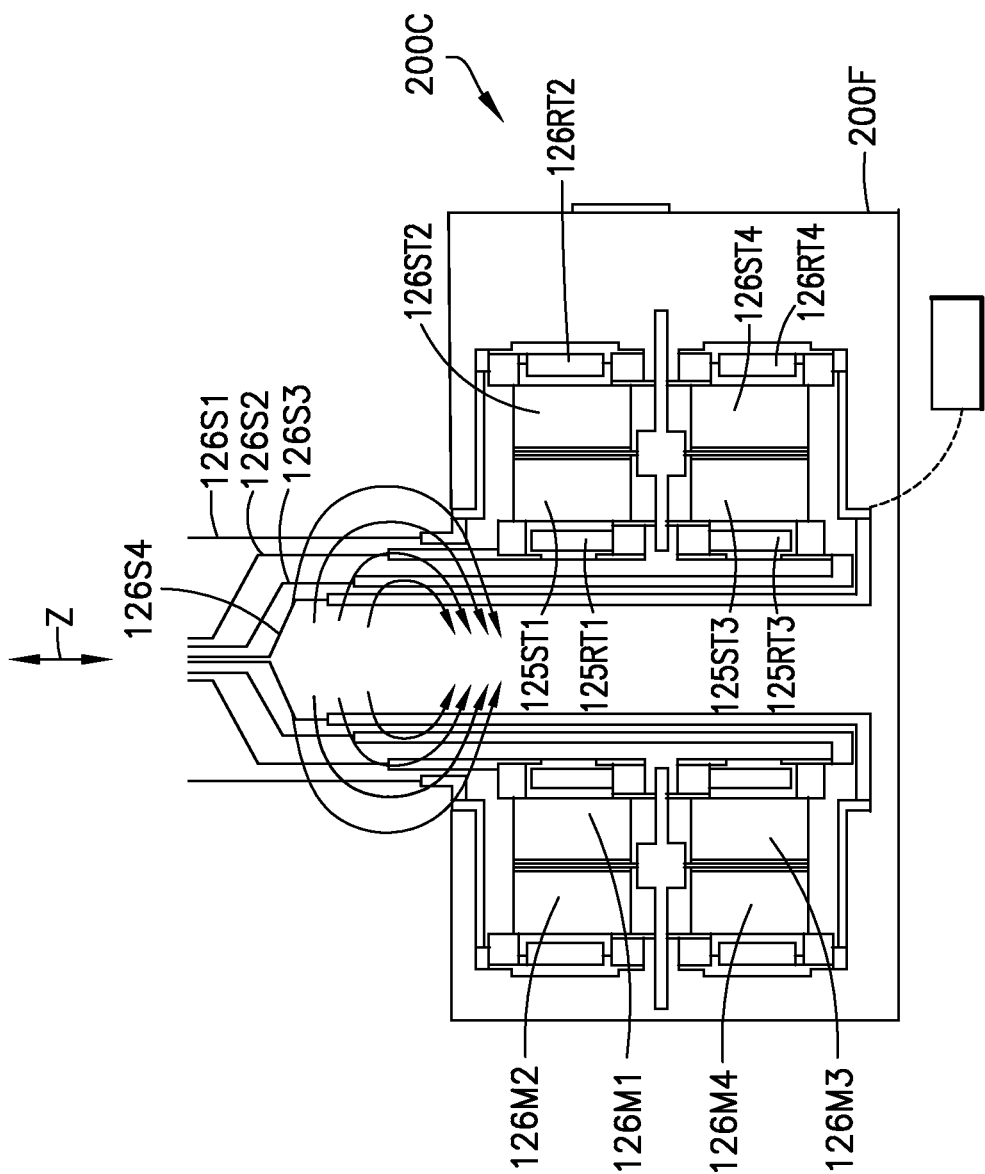

Drive section 200C, illustrated in FIG. 2D, includes a four motor nested or concentric configuration such that four drive shafts 126S1-126S4 are arranged coaxially and four motors 126M1-126M4 are arranged in a nested coaxial arrangement. For example, motor 126M1 is nested within (e.g., is radially surrounded by) motor 126M2 and motor 126M3 is nested within motor 126M4. The nested motors 126M1, 126M2 are coaxially arranged relative to nested motors 126M3, 126M4 so that nested motors 126M1, 126M2 are disposed coaxially above nested motors 126M3, 125M4. However, it should be understood that the motors 126M1-126M4 may have any suitable arrangement such as a stacked arrangement, a side by side, or concentric arrangement as shown in FIG. 2D. In other aspects, the motors may be low profile planar or "pancake" style robot drive configuration where the motors are concentrically nested within each other in a manner substantially similar to that described in U.S. Pat. No. 8,008,884 entitled "Substrate Processing Apparatus with Motors Integral to Chamber Walls" issued on Aug. 30, 2011 and U.S. Pat. No. 8,283,813 entitled "Robot Drive with Magnetic Spindle Bearings" issued on Oct. 9, 2012, the disclosures of which are incorporated by reference herein in their entireties.

While the motors are illustrated as rotary motors in other aspects any suitable motor(s) and/or suitable drive transmission(s) may be used such as, for example, a direct drive linear motor, linear piezo electric motors, linear inductance motors, linear synchronous motors, brushed or brushless linear motors, linear stepper motors, linear servo motors, reluctance motors, etc. Examples of suitable linear motors are described in, for example, U.S. patent application Ser. No. 13/286,186 entitled "Linear Vacuum Robot with Z Motion and Articulated Arm" filed on Oct. 31, 2011; Ser. No. 13/159,034 entitled "Substrate Processing Apparatus" filed on Jun. 13, 2011 and U.S. Pat. No. 7,901,539 entitled "Apparatus and Methods for Transporting and Processing Substrates" issued Mar. 8, 2011; U.S. Pat. No. 8,293,066 entitled "Apparatus and Methods for Transporting and Processing Substrates" issued Oct. 23, 2012; U.S. Pat. No. 8,419,341 entitled "Linear Vacuum Robot with Z Motion and Articulated Arm" issued Apr. 16, 2013; U.S. Pat. No. 7,575,406 entitled "Substrate Processing Apparatus" issued Aug. 18, 2009; and U.S. Pat. No. 7,959,395 entitled "Substrate Processing Apparatus" issued Jun. 14, 2011, the disclosures of which are incorporated herein by reference in their entireties.

Figure 3A:
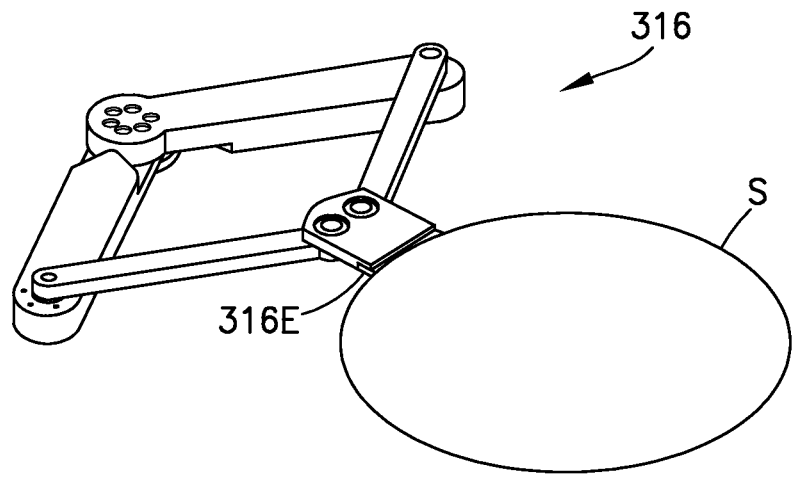
FIGS. 3A-3E are schematic illustrations of transport arms in accordance with aspects of the disclosed embodiment.
Figure 3B:
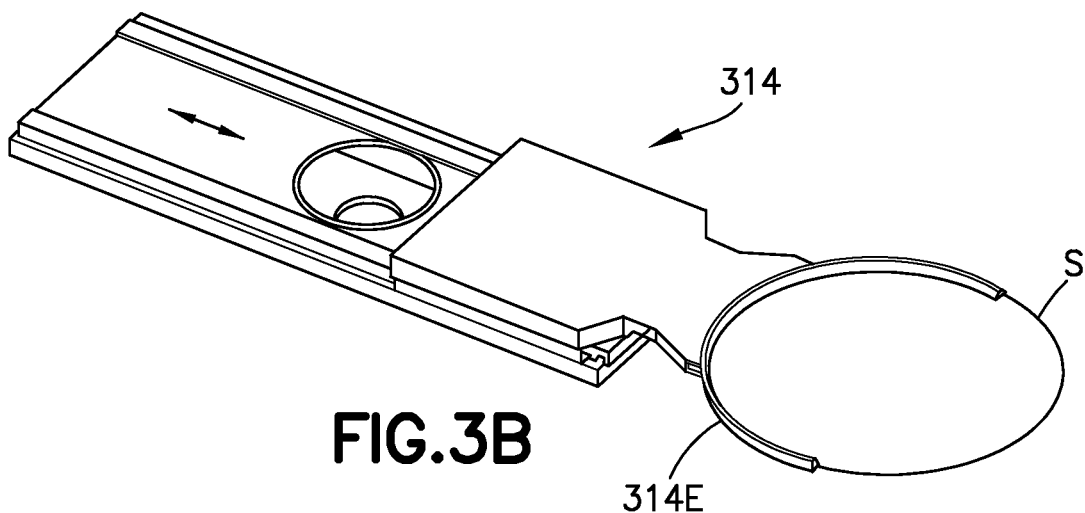
Figure 3C:
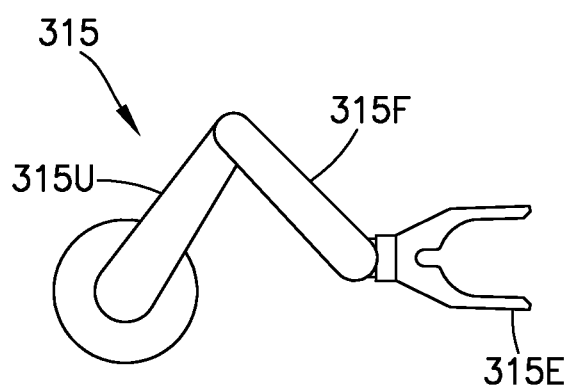
Figure 3D:
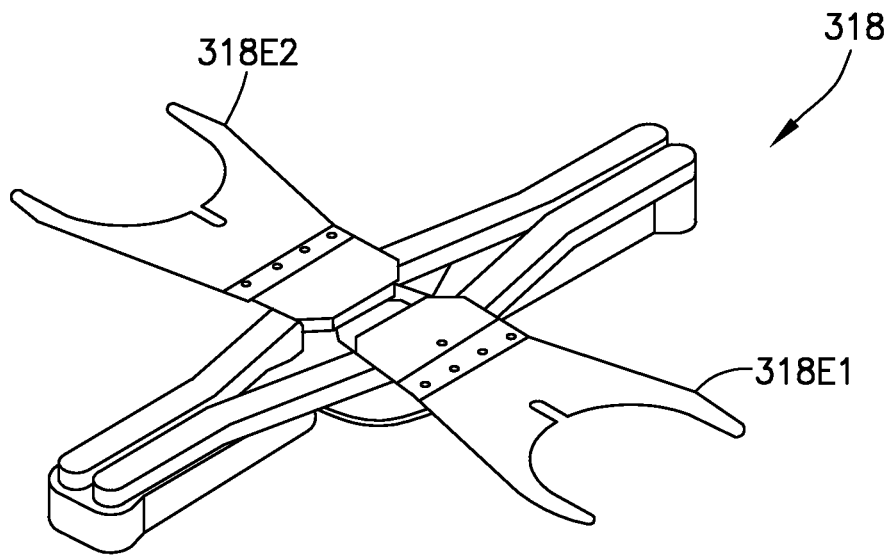
Figure 3E:
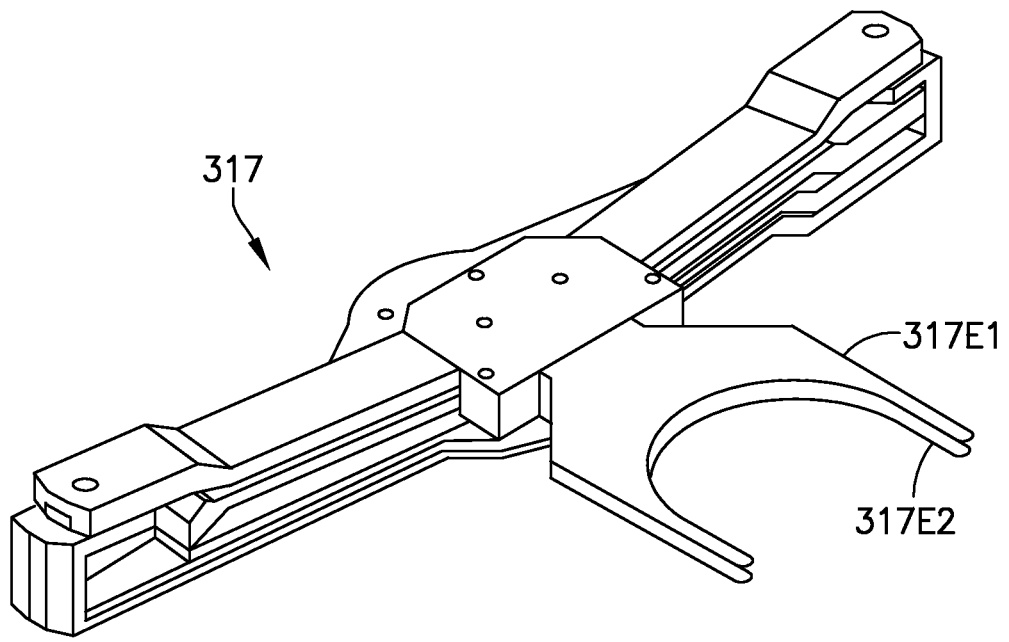

Referring now to FIGS. 3A-3E, the boom arm 143 and/or substrate transport apparatus 104 may include any suitable arm linkage mechanism(s). Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and U.S. patent application Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm of each substrate transport apparatus 104, the boom arm 143 and/or the linear slide 144 may be derived from a conventional SCARA arm 315 (selective compliant articulated robot arm) (FIG. 3C) type design, which includes an upper arm 315U, a band-driven forearm 315F and a band-constrained end-effector 315E, or from a telescoping arm or any other suitable arm design, such as a Cartesian linearly sliding arm 314 (FIG. 3B). Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 100G, the disclosures of which are incorporated by reference herein in their entireties.

The operation of the transfer arms may be independent from each other (e.g., the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 316 (FIG. 3A) configuration, a leap frog arm 317 (FIG. 3E) configuration, a bi-symmetric arm 318 (FIG. 3D) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and U.S. patent application Ser. No. 13/270,844 entitled "Coaxial Drive Vacuum Robot" and filed on Oct. 11, 2011 the disclosures of which are all incorporated by reference herein in their entireties. It is noted that the boom arm 143 may have a configuration substantially similar to transport arms 314, 315, 316, 317, 318 where the substrate transport apparatus 104 is mounted to the boom arm 143 in place of the end effector 315E, 316E, 317E1, 317E1, 318E1, 318E2. As may be realized, the transport arm(s) 314, 315, 316, 317, 318 are rotatably coupled to a respective drive section 200, 200A, 200B, 200C in accordance with the aspects of disclosed embodiment so that the respective drive section 200, 200A, 200B, 200C effects substantially non-friction torque transfer from the drive section 200, 200A, 200B, 200C to the transport arm 314, 315, 316, 317, 318 to effect articulated motion of the transport arm 314, 315, 316, 317, 318 relative to a frame, such as frame 200F or any suitable frame of the processing tool 100A-100H. As will be described in greater detail below, any suitable controller, such as controller 110, is coupled to the drive section 200, 200A, 200B, 200C in any suitable manner to drive the drive section 200, 200A, 200B, 200C so as to effect the articulation of the transport arm 314, 315, 316, 317, 318.

Referring now to FIG. 4, an exemplary substrate transport apparatus 104A is illustrated in accordance with aspects of the disclosed embodiment. The substrate transport apparatus 104A is substantially similar to the substrate transport 104 described above with respect to FIGS. 1A-1D and 1G-1K and may be employed in any suitable atmospheric or vacuum environment such as those described above with respect to the processing apparatus 100A, 100B, 100C, 100D, 100E, 100F, 100G, 100H. In one aspect the substrate transport apparatus 104A may be at least partially disposed in exemplary transport chamber 125' which may be substantially similar to any one of the transport chambers 125A, 125B, 125C, 125D, 125E, 125F described above.

The substrate transport apparatus 104A includes a base 400BA having a drive section 200' disposed therein. The substrate transport apparatus 104A further includes a transport arm 315' rotatably coupled to the drive section 200'. The transport arm 315' includes an upper arm 401, a forearm 402, and an end effector 403. It is noted that although the drive section 200' is depicted and described as being a tri-axial drive section (substantially similar to drive section 282 described above with respect to FIG. 2C); the drive section 200' may have any suitable drive section configuration, such as, those described above with respect to FIGS. 2A, 2B, and 2D. Further, while the transport arm 315' is depicted and described as having a configuration substantially similar to the conventional SCARA arm 315 described above with respect to FIG. 3C, the transport arm 315' may have any suitable arm configuration, such as, the arm configurations 314, 316, 317, 318 described above. As may be realized, the substrate transport apparatus 104A may be any other suitable substrate transport that has at least one torque coupling between a rotary drive member driving a rotary follower member.

As may be realized, the substrate transport apparatus 104A is connected to and communicates with any suitable controller, such as the controller 110 described above, so that the controller 110 may control the movements of the transport arm 315'. More specifically, the controller 110 includes a controller module 110M that is configured to command positional movement of the substrate transport apparatus 104A to move the end effector 403 of the transport arm 315' to any desired position within the processing apparatus 100A, 100B, 100C, 100D, 100E, 100F, 100G, 100H (that is within reach of the substrate transport apparatus 104A) in a known and controlled manner. For example the transport arm 315' may be coupled to the drive section 200' which may be any suitable drive section such as those described previously (i.e., a harmonic drive, fixed base drive, three axis, etc.), and may include a controller module 110M having any suitable non-transitory program code for effecting operation of the substrate transport apparatus 104A. In one aspect, controller 110 may be configured as a bang-bang controller for generating time-optimal motions of at least a portion of the substrate transport apparatus 104A, such as the end effector 403, using maximum torque $\tau_{max}$ of the drive section 200'. The drive section 200' may include any desired position determining devices (e.g., such as the position or motor encoder 296; FIG. 2A) that is connected to the controller module 110M of the controller 110. The encoder 296 sends any suitable signal(s) to the controller module 110M enabling the controller module 110M to determine a position of a predetermined point (such as the end effector center or any other suitable location) on the transport arm 315' relative to the transport chamber 125'.

In the exemplary embodiment shown in FIG. 4, the drive section 200' is disposed in the base 400BA which houses a multi-axis drive spindle assembly 410, and three motors 420, 421, 422. The multi-axis drive spindle assembly 410 has three drive shafts 410A, 410B, 410C arranged in, e.g., a coaxial configuration. In this aspect, the drive shafts 410A, 410B, 410C are comprised of stainless steel, but may be any other suitable material. As noted above, in other aspects, the drive section may have more or fewer than three motors and more or fewer than three drive shafts.

The three motors 420, 421, 422 each comprise a stator 420ST, 421ST, 422ST and a rotor 420RT, 421RT, 422RT coupled to a respective one of an inner drive shaft 410A, a middle drive shaft 410B, and an outer drive shaft 410C. Each stator 420ST, 421ST, 422ST generally comprises an electromagnetic coil and is stationarily attached to the base 400BA at different vertical heights or locations along the base 400BA. Each rotor 420RT, 421RT, 422RT is comprised of permanent magnets, but may alternatively comprise a magnetic induction rotor which does not have permanent magnets and may be rotatably coupled to each respective drive shaft 410A, 410B, 410C in accordance with the aspects of the disclosed embodiment described herein. Various bearings may be provided about the drive shafts 410A, 410B, 410C and the base 400BA to allow each drive shaft 410A, 410B, 410C to be independently rotatable relative to each other and the base 400BA. Each drive shaft 410A, 410B, 410C may be provided with a suitable position sensor/encoder to provide position signals for a respective drive shaft 410A, 410B, 410C to the controller 110 for determining the rotational position of the drive shafts 410A, 410B, 410C relative to each other and/or relative to the base 400BA. Any suitable sensor/encoder could be used, such as an optical or induction sensor.

Still referring to FIG. 4, the upper arm 401 of the transport arm 315' is coupled, through a dimensionally substantially invariant interface, to the outer drive shaft 410C of the drive section 200' at a shoulder 404 of the substrate transport apparatus 104A, so that the outer drive shaft 410C and upper arm 401 rotate together as a unit about a shoulder axis of rotation Z1 with repeatability and accuracy as described further below. The upper arm 401 generally includes an upper arm housing 401H and an upper arm bearing collar 401BC.

The forearm 402 is coupled, via an elbow drive shaft assembly 430, to the upper arm 401 at an elbow 405 of the substrate transport apparatus 104A. The forearm 402 generally includes a forearm housing 402H and a forearm bearing collar 402BC (dependent from the forearm housing 402H and independent of elbow drive shaft assembly 430 within the housing in a manner similar to what will be described in greater detail below). The inner drive shaft 410A is operably coupled to a first transmission 470 in the upper arm 401. The first transmission 470 includes a drive pulley 471, an idler pulley 472 and drive bands 473. The drive pulley 471 is coupled, through a dimensionally substantially invariant interface, to the inner drive shaft 410A (as will be described further below) and is connected by drive bands 473 to the idler pulley 472. The idler pulley 472 is coupled, through a dimensionally substantially invariant interface, to an elbow outer drive shaft 431 (also as will be described further below) of the elbow drive shaft assembly 430 so that the idler pulley 472 and the elbow outer drive shaft 431 rotate accurately and repeatably as a unit. The elbow drive shaft assembly 430 connecting the forearm 402 to the upper arm 401 is rotatably supported from the upper arm 401 by suitable bearings which allow the elbow drive shaft assembly 430 to rotate about an elbow axis of rotation Z2 relative to the upper arm 401. The forearm 402 is coupled, through a dimensionally substantially invariant interface, to the elbow outer drive shaft 431 of the elbow drive shaft assembly 430 so that the elbow outer drive shaft 431 and forearm 402 rotate accurately and repeatably as a unit about the axis Z2. The forearm 402 is rotated about axis Z2 when the drive pulley 471 of the first transmission 470 in the upper arm 401 is rotated by inner drive shaft 410A of drive section 200'. Thus, the inner drive shaft 410A of drive section 200' is used to independently rotate the forearm 402 relative to the upper arm 401.

The end effector 403 is coupled to the forearm 402 by a wrist drive shaft 440 at a wrist 406 of the substrate transport apparatus 104A. The middle drive shaft 410B is operably coupled to a second transmission 480 in the upper arm 401. The second transmission 480 in the upper arm 401 includes a drive pulley 481, an idler pulley 482 and drive bands 483. The drive pulley 481 is coupled, through a dimensionally substantially invariant interface, to the middle drive shaft 410B of the multi-axis drive spindle assembly 410 in the drive section 200'. The idler pulley 482 is coupled, through a dimensionally substantially invariant interface, to an elbow inner drive shaft 432 of the elbow drive shaft assembly 430 (connecting the forearm 402 to the upper arm 401). The drive bands 483 connect the drive pulley 481 to the idler pulley 482. The elbow inner drive shaft 432 of the elbow drive shaft assembly 430 is operably connected to a third transmission 490 in the forearm 402. The third transmission 490 in the forearm 402 includes the drive pulley 491, an idler pulley 492 and drive bands 493. The drive pulley 491 is coupled, through a dimensionally substantially invariant interface, to the elbow inner drive shaft 432 of the elbow drive shaft assembly 430. The idler pulley 492 is coupled, through a dimensionally substantially invariant interface, to the wrist drive shaft 440. The drive bands 493 connect the drive pulley 491 to idler pulley 492. The wrist drive shaft 440 is rotatably supported from the forearm 402 by suitable bearings which allow the wrist drive shaft 440 to rotate about a wrist axis of rotation Z3 relative to the forearm 402. The end effector 403 is coupled, through a dimensionally substantially invariant interface, to the wrist drive shaft 440 so as to rotate accurately and repeatably as a unit about the axis Z3. The end effector 403 is rotated about the axis Z3 when idler pulley 492 of the third transmission 490 is rotated by the drive pulley 491. The drive pulley 491 in turn is rotated by elbow inner drive shaft 432 of the elbow shaft assembly 430. The elbow inner drive shaft 432 is rotated when idler pulley 482 of the second transmission 480 in the upper arm 401 is rotated by middle drive shaft 410B of the drive section 200'. Hence, the end effector 403 may be independently rotated with respect to forearm 402 and upper arm 401 about the axis Z3 with repeatability and accuracy as described further below.

Figure 5:
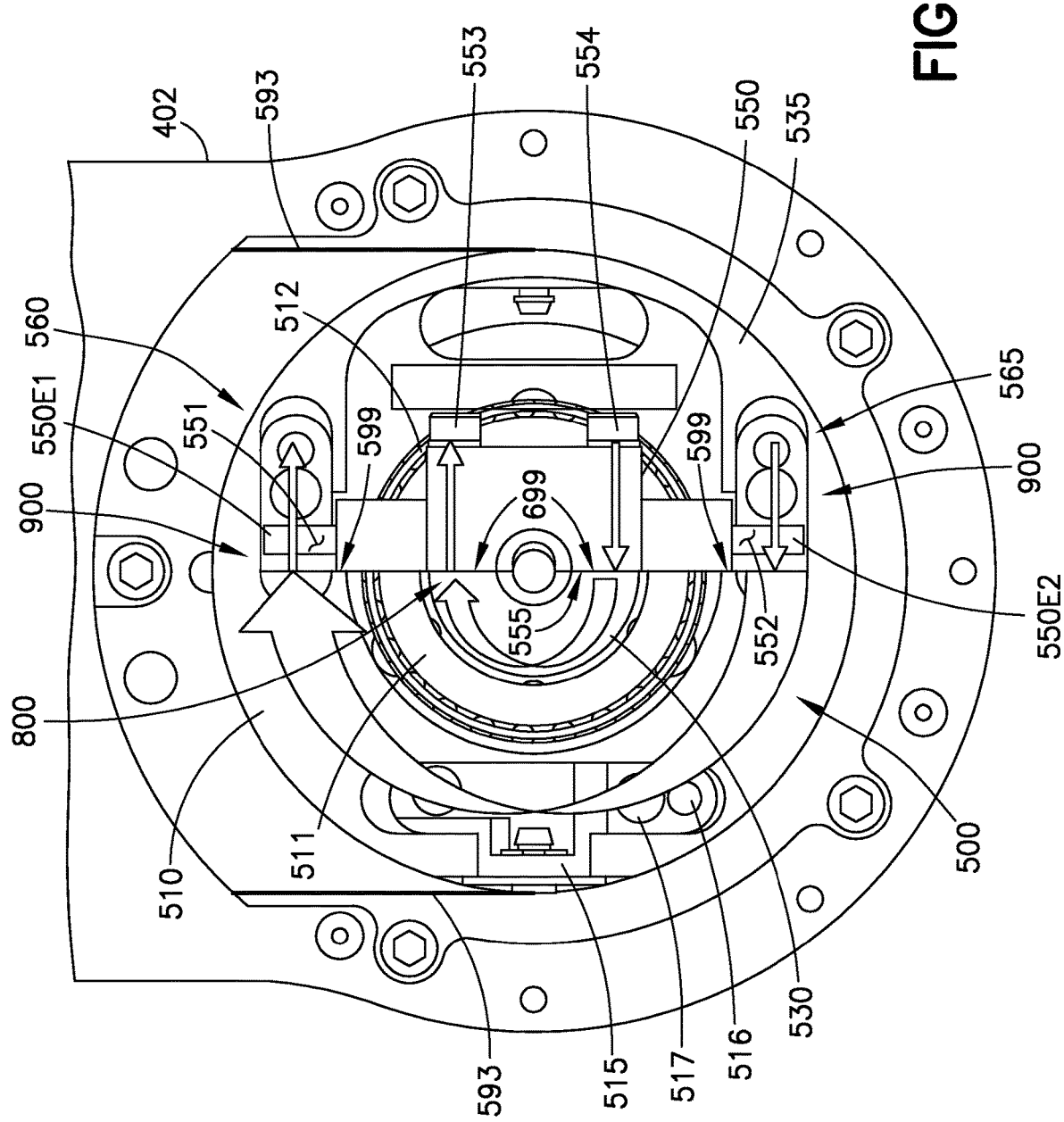
FIG. 5 is a schematic illustration of a portion representative of various aspects of the substrate transport apparatus illustrated in FIGS. 1-4 in accordance with aspects of the disclosed embodiment.
Figure 10:
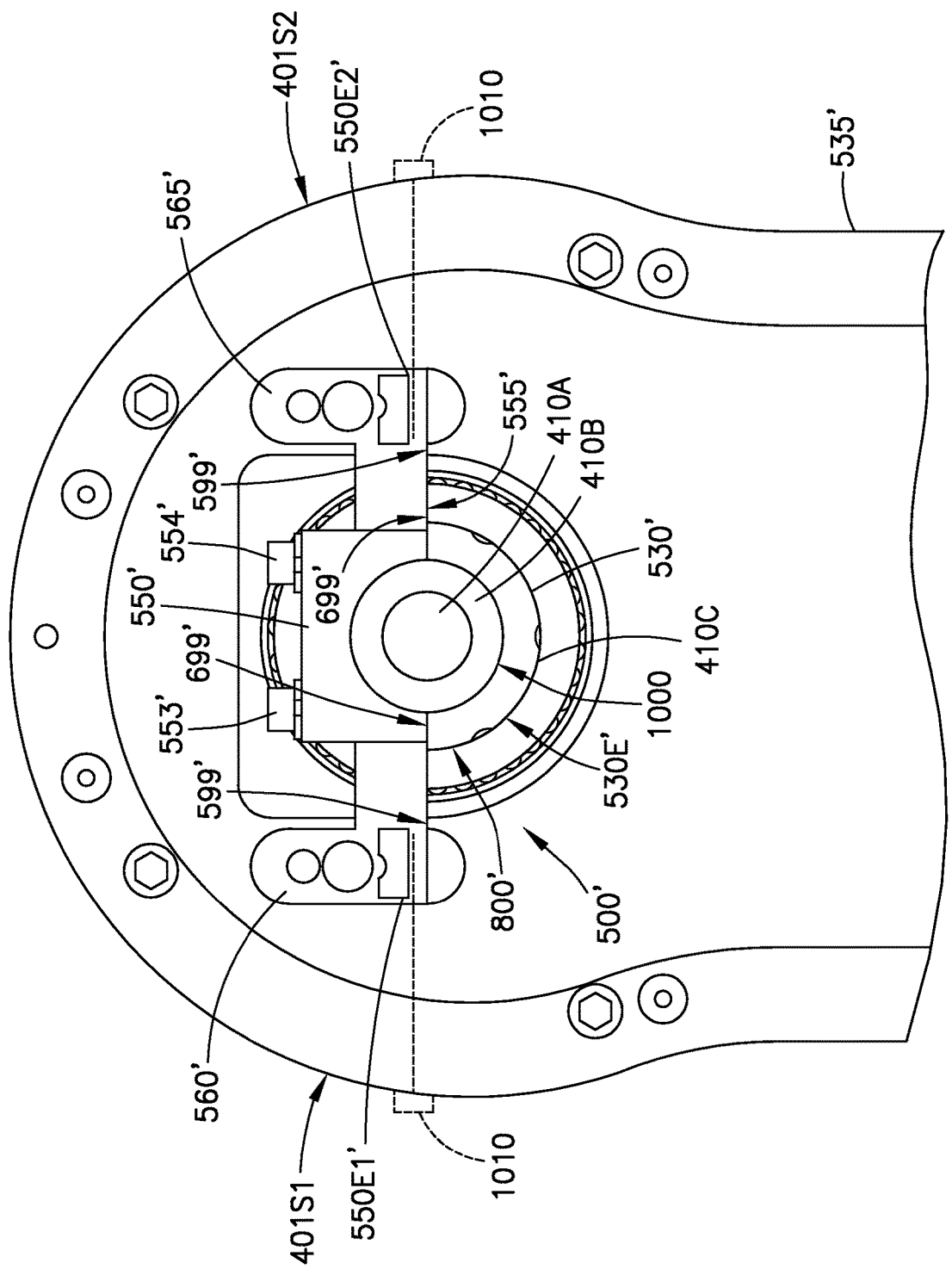
FIG. 10 is a plan view schematic illustration of a portion representative of various aspects of the substrate transport apparatus illustrated in FIG. 1-4 in accordance with aspects of the disclosed embodiment.

Each of the rotatable couplings of the substrate transport apparatus 104A is defined by a torque coupling between a rotary or torsional motion driver member 530 (i.e., referring to each of the driving members, e.g., drive shafts 410A, 410B, 410C, 431, 432, 440; rotors 420RT, 421RT, 422RT; and idler pulleys 472, 482, 492) and a rotary or torsional motion follower member 535 (i.e., referring to each of the driven members, e.g., arm link 401, 402, 403; pulley 471, 481, 491; and drive shafts 410A, 410B, 410C, 431, 432, 440). It is noted that in some instances, a torsional motion driver member may also be a torsional motion follower member. For example, the elbow inner drive shaft 432 is a torsional motion follower member with respect to the torque coupling between the elbow inner drive shaft 432 and the idler pulley 482, while also being a torsional motion driver member with respect to the torque coupling between the elbow inner drive shaft 432 and the drive pulley 491. In one aspect, the rotary follower member 535 is located at least partially inside the rotary drive member 530, so that the rotary drive member 530 is disposed around at least part of the rotary follower member 535 (e.g., the elbow inner drive shaft 432 is located at least partially inside the idler pulley 482). In another aspect, the rotary driver member 530 is located at least partially inside the rotary follower member 535, so that the rotary follower member 535 is disposed around at least part of the rotary drive member 530 (e.g., the elbow inner drive shaft 432 is located at least partially inside the drive pulley 491). Each torsional motion driver member 530 and respective torsional motion follower member 535 are coupled together to transfer torque between one another via a substantially non-friction torque transfer with a dimensionally substantially invariant interface 500, 500' (FIGS. 5 and 10).

For example, referring to FIGS. 5-9, the torque coupling 499 (FIG. 4) between the torsional motion driver member 530 (e.g., elbow inner drive shaft 432) and the torsional motion follower member 535 (e.g., the drive pulley 491) will be described according to the aspects of the disclosed embodiments. It is noted that although aspects of the disclosed embodiment are described herein for convenience only with specific reference to the torque coupling 499 between, e.g., the elbow inner drive shaft 432 and the drive pulley 491, one or more other torque couplings of the substrate transport apparatus 104A may have substantially similar features and be coupled in substantially the same way as previously noted.

As noted above, the torsional motion follower member 535 is coupled to the torsional motion driver member 530. More specifically, the torsional motion follower member 535 is coupled to the torsional motion driver member 530 with the dimensionally substantially invariant interface 500 (also referred to as a contact torque transfer interface) to transfer torque from the torsional motion driver member 530 to the torsional motion follower member 535. In one aspect, the dimensionally substantially invariant interface 500 is a rigid, substantially non-slip interface. The dimensionally substantially invariant interface 500 is configured so that the rigid, substantially non-slip interface has a predetermined repeatable bi-directional rigidity and substantially non-slip contact at the dimensionally substantially invariant interface 500. The predetermined repeatable bi-directional rigidity and substantially non-slip contact effects torque transfer of the torque, from, e.g., the torsional motion driver member 530 to the torsional motion follower member 535, via substantially non-friction transfer. As noted above, the controller 110 may be a bang-bang controller configured to apply max torque $\tau_{max}$ to the substrate transport apparatus 104A. The dimensionally substantially invariant interface 500 is configured to be rigid and substantially invariant (with respect to producing motion repeatability improved over known substrate transport apparatus and, in some specific instances, better than about 100 microns, across the full range of motion of the transient) for each direction of torque applied to the torque couplings (i.e., bi-directional). For example, the dimensionally substantially invariant interface 500 is rigid and substantially invariant from zero torque applied to max torque $+\tau_{max}$ applied and each transient therebetween. Further the dimensionally substantially invariant interface 500 is rigid and substantially invariant throughout torque transients wherein the direction of applied torque is switched to the opposite direction (i.e., from $+\tau_{max}$ to $-\tau_{max}$ such as when the substrate transport apparatus 104A is fully extended and the torque is switched to retract the substrate transport apparatus 104A). The dimensionally substantially invariant interface 500 is rigid and substantially invariant through the application of each transient torque (i.e., from $-\tau_{max}$ through $+\tau_{max}$). In one aspect, it is noted that $\tau_{max}$ is maximum rated motor torque, such as would be applied by a controller effecting optimal (e.g., time-optimal) "bang-bang" control of the substrate transport apparatus motion trajectory. In one aspect, the dimensionally substantially invariant interface 500 is also configured to be rigid and substantially invariant at all times including during teaching/setup of the substrate transport apparatus 104A to operating at a steady state operating condition, including in vacuum and at any temperature. The dimensionally substantially invariant interface 500 is configured to be rigid and substantially invariant for all ranges of temperature during operation in, for example, the processing stations 130 which may operate with temperatures of about 400° F. or more. The dimensionally substantially invariant interface 500 is configured to be rigid and substantially invariant both at "cold" temperatures (i.e., during initial warm-up or when not operating) and at operating temperatures (e.g., the operating temperature of the processing station 130 or of the transport chamber 125A-F).

Figure 6A:
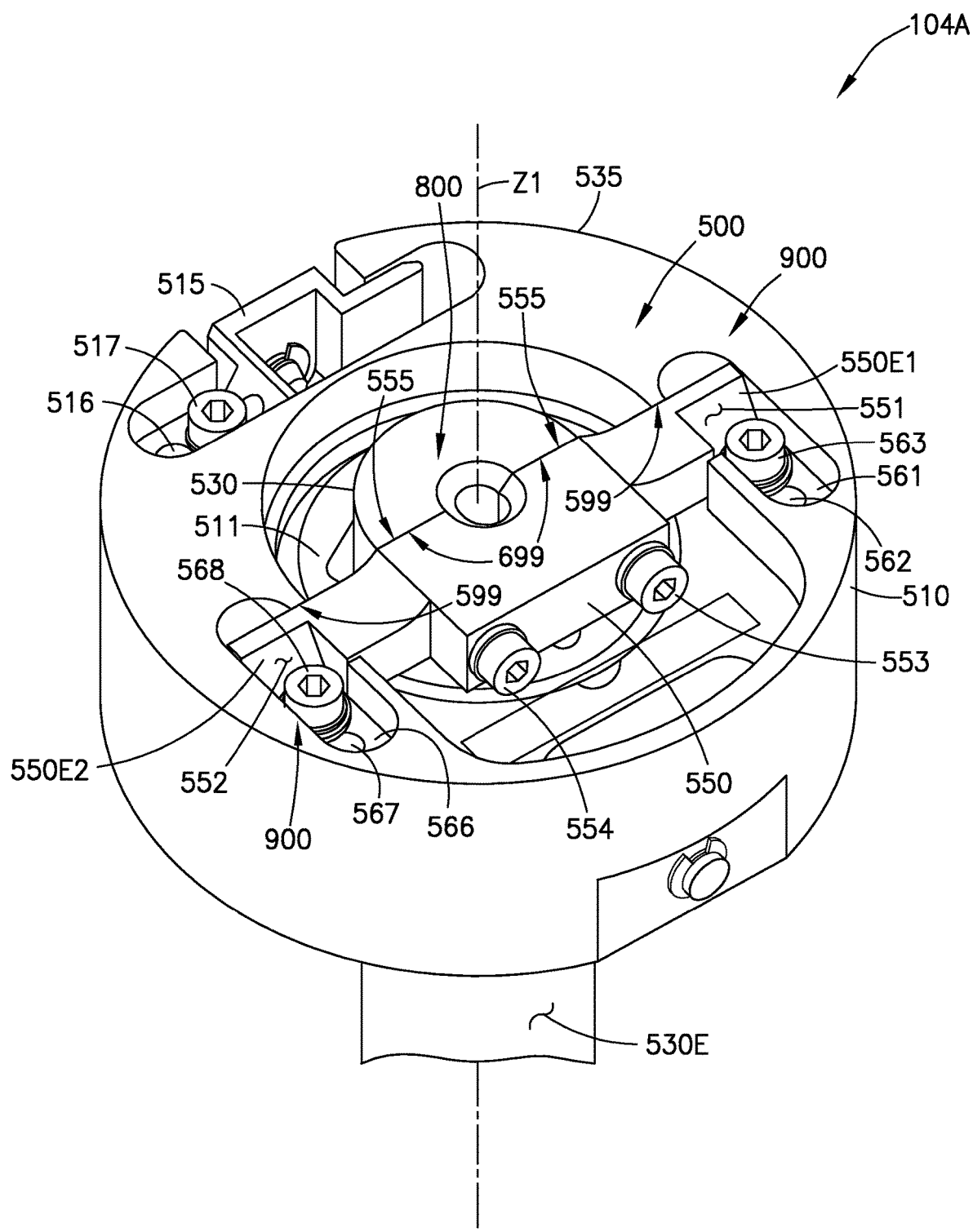
FIGS. 6A-6C are perspective views respectively of schematic illustrations of a portion of the substrate transport apparatus illustrated in FIG. 4 in accordance with aspects of the disclosed embodiment.
Figure 6B:
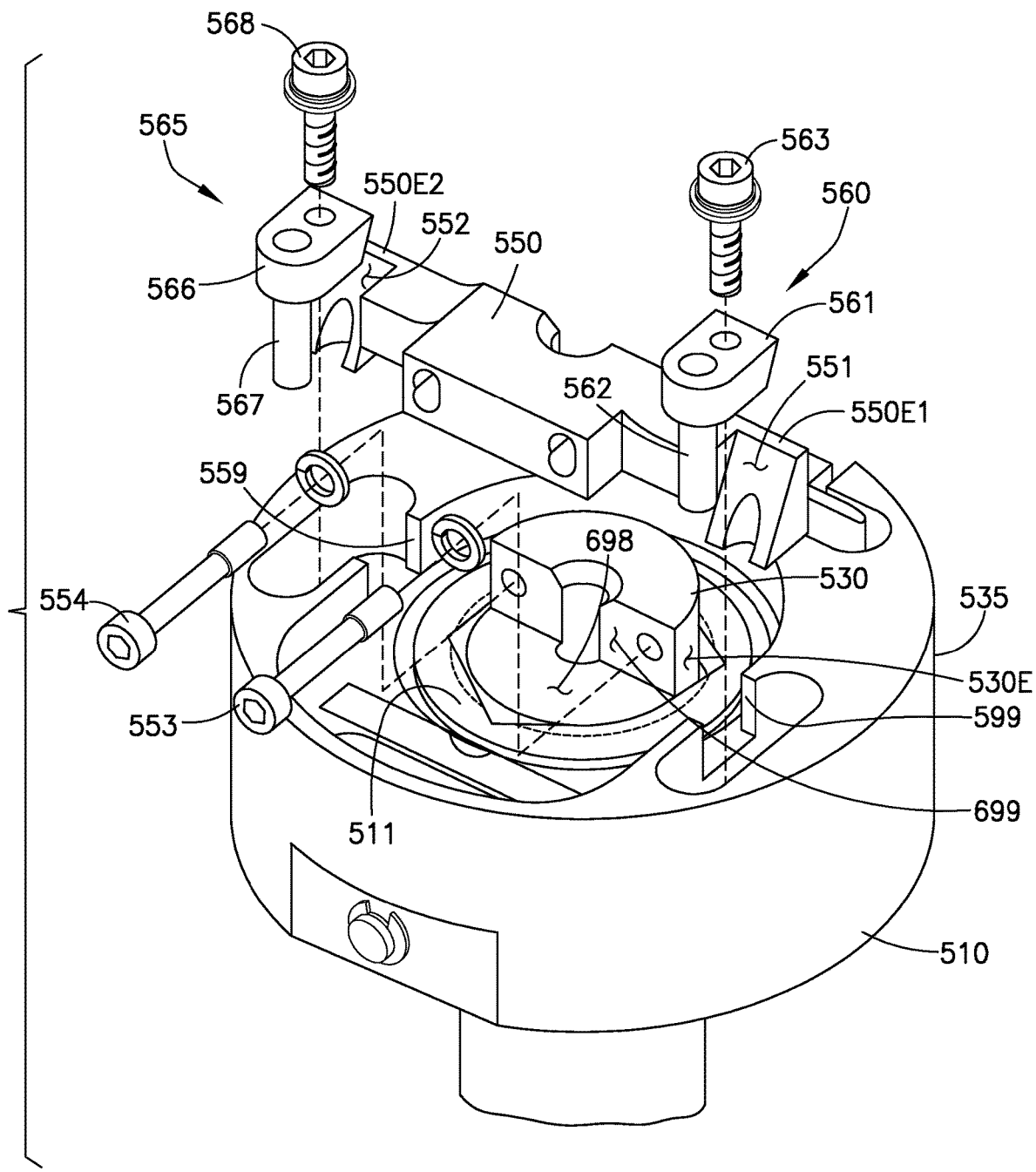

In this aspect, the torsional motion driver member 530 has an exterior perimeter 530E (FIG. 6B) circumscribing the elbow axis of rotation Z2. The torsional motion driver member 530 includes a driver member position datum surface 699 and a seat surface 698 (FIG. 6B). The driver member position datum surface 699 defines, in part, the dimensionally substantially invariant interface 500 as will be further described below.

Figure 9:
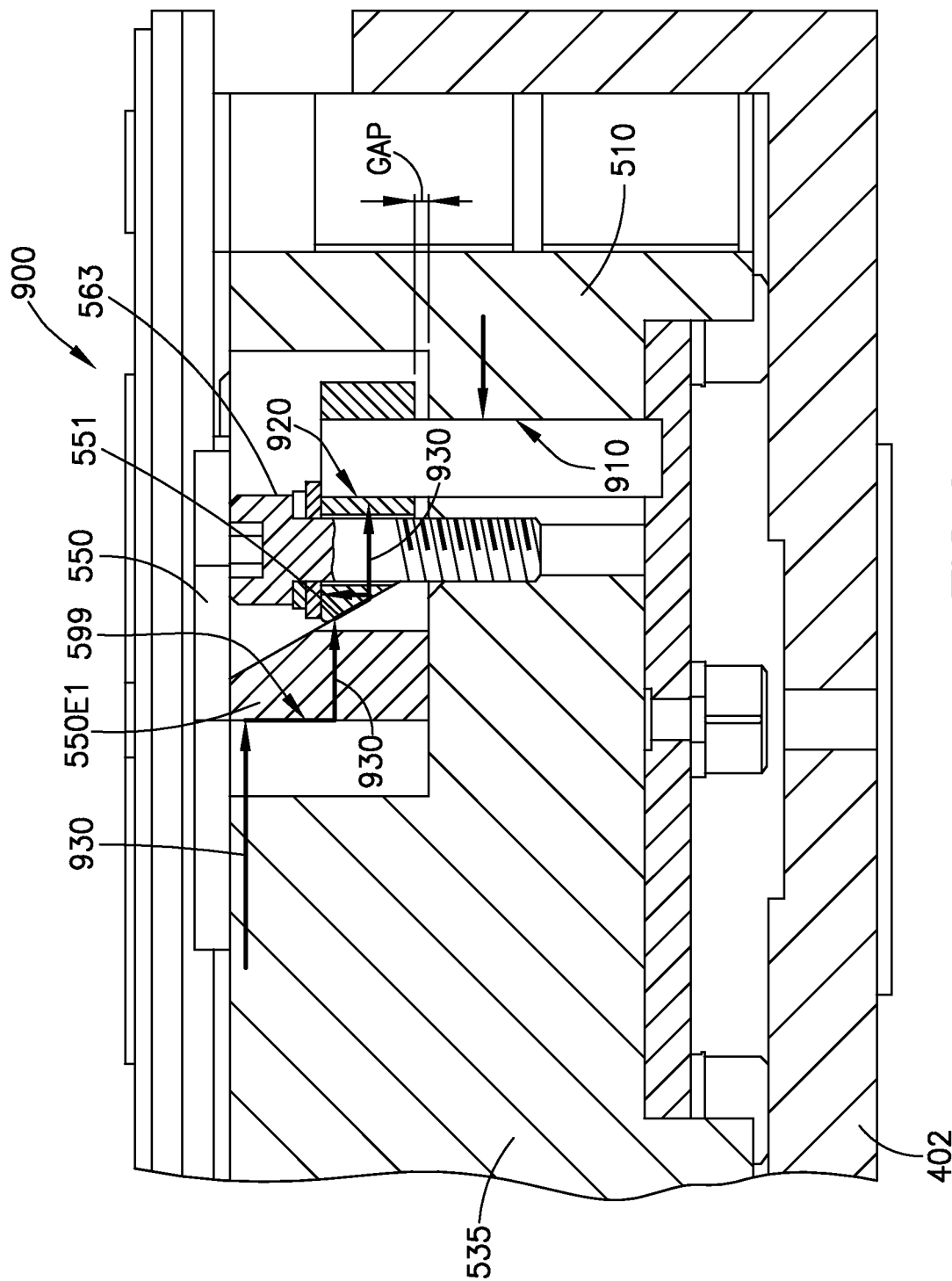
FIG. 9 is an enlarged partial cross section elevation schematic illustration of a portion of the substrate transport apparatus illustrated in FIG. 5 in accordance with aspects of the disclosed embodiment.

The torsional motion follower member 535 includes a body portion 510 and a bearing collar 511 rotatably coupled to the body portion 510. The body portion 510 of the torsional motion follower member 535 includes a follower member position datum surface 599 and a follower engagement surface 910 (FIG. 9). In one aspect, the torsional motion follower member 535 further includes at least one bearing 512 (FIG. 8) seating the body portion 510 on the bearing collar 511. The bearing collar 511 includes threads 511T (FIG. 8) which are configured to couple with, e.g., threads 402T of the arm link housing 402H, e.g., the forearm 402. As can be best seen in FIGS. 7 and 8, in one aspect, bearing races 512A, 512B of the at least one bearing 512 depend from, for example, the torsional motion follower member 535, independent of the torsional motion driver member 530 so that the bearing collar 511 is independent of the torsional motion driver member 530 (i.e., the bearing collar 511 does not couple directly to the torsional motion driver member 530 such that the exterior perimeter 530E of the torsional motion driver member 530, as a whole, is free of the bearing collar 511 (e.g., when compared to a conventional SCARA torque coupling where the bearing collar depends from or is seated directly on or against the drive shaft in a friction coupling). In one aspect, the bearing collar 511 is also decoupled from the dimensionally substantially invariant interface 500. The bearing collar 511 may be comprised of stainless steel or any other suitable material and may have a low thermal expansion coefficient. For example, the bearing collar 511 may be comprised of 17-H900 stainless steel which has, e.g., a mean coefficient of thermal expansion of $5.8 \times 10^6$ in/in/° F. (10.4 µm/m·K) at a temperature range of $-100$-$70°$ F. ($-73$-$21°$ C.), a mean coefficient of thermal expansion of $6.0 \times 10^6$ in/in/° F. (10.8 µm/m·K) at a temperature range of 70-200° F. (21-93° C.), a mean coefficient of thermal expansion of $6.3 \times 10^6$ in/in/° F. (11.3 µm/m·K) at a temperature range of 70-600° F. (21-316° C.), or a mean coefficient of thermal expansion of $6.5 \times 10^6$ in/in/° F. (11.7 µm/m·K) at a temperature range of 70-800° F. (21-427° C.). In one aspect, the bearing collar 511 comprises a drive feature.

The driver member position datum surface 699 of the torsional motion driver member 530 and the follower member position datum surface 599 of the body portion 510 of the torsional motion follower member 535 are disposed in a predetermined alignment which sets a predetermined position of the torsional motion driver member 530 and the torsional motion follower member 535 with respect to each other. In one aspect, the dimensionally substantially invariant interface 500 has a configuration that complements the driver member position datum surface 699 of the torsional motion driver member 530 and the follower member position datum surface 599 of the torsional motion follower member 535. With this configuration, the dimensionally substantially invariant interface 500 engaging with the driver member position datum surface 699 and the follower member position datum surface 599 effects a repeatable predetermined concentric position of the dimensionally substantially invariant interface 500 with respect to both the torsional motion follower member 535 and the torsional motion driver member 530.

Still referring to FIGS. 5-9, in one aspect, the substrate transport apparatus 104A further includes a torque bar 550 (also referred to as a rotary torque transfer coupling), a first biasing member 560, and a second biasing member 565. In one aspect, the torque bar 550 includes a first end 550E1 having a first wedge surface 551 disposed thereon, a second end 550E2 having a second wedge surface 552 disposed thereon, a thrust face 555 disposed between the first and second ends 550E1, 550E2, and at least one torque bar attachment member 553, 554. The torque bar 550 is configured to sit on (or be seated on) the seat surface 698 of the torsional motion driver member 530 and couple to the torsional motion driver member 530 via the torque bar attachment member 553, 554 (e.g., threaded clearance cap bolts disposed for substantially only axial loading from engagement with the torsional motion driver member 530 and torque bar 550). The at least one torque bar attachment member 553, 554 is configured to preload the torque bar 550 with respect to the torsional motion driver member 530 and may be, e.g., a nut and bolt, screws, or any other suitable fastener member. The torque bar 550 is further configured to couple to the torsional motion follower member 535 (as described herein), thereby effecting coupling of the torsional motion follower member 535 to the torsional motion driver member 530. In other aspects, the torsional motion driver member and the torque bar element may be formed as a one piece unit (e.g., monolithic), so that the torsional motion driver member and the torque bar define a one piece unit. Such, integral one piece unit of the torsional motion driver member and the torque bar, is coupled similarly with the first and second biasing members 560, 565 to the torsional motion follower member 535 as illustrated in FIGS. 5 and 9.

In one aspect, the torque bar 550 defines, in part, the dimensionally substantially invariant interface 500. For example, in one aspect, the dimensionally substantially invariant interface 500 is disposed on the torque bar 550 and engages simultaneously the torsional motion driver member 530 and the torsional motion follower member 535. This engagement of the torque bar 550 with the torsional motion driver member 530 and the torsional motion follower member 535, simultaneously, effects the transfer of rotational motion/torsion (or torque) from the torsional motion driver member 530 to the torsional motion follower member 535. In one aspect, the thrust face 555 of the torque bar 550 is configured to engage the driver member position datum surface 699 of the torsional motion driver member 530 and defines at least part of the dimensionally substantially invariant interface 500. The thrust face 555 engagement with the driver member position datum surface 699 defines a controlled distributed contact thrust interface 800 (FIG. 5) configured to distribute, from the torsional motion driver member 530, a substantially uniform thrust load across a face of the dimensionally substantially invariant interface 500 to the torque bar 550. The preload between the respective thrust face 555 of the torque bar 550, and position datum surface 699 of the torsional motion driver member 530, is applied (via attachment member 553, 554) as described so that a substantially uniform thrust load is generated across the interface at $\tau_{max}$ and transients in-between. In the aspect of the integral torsional motion driver member and torque bar formed as a one piece unit, the thrust interface is eliminated, and the torque bar portion may be shaped in plan and cross-section to effect substantially uniform torque and motion transfer load distribution commensurate with uniform transfer loads. As may be realized, the engagement between the torsional motion follower member 535 and the integral monolithic torsional motion driver member and torque bar remains decoupled from the exterior perimeter surface, of the integral monolithic torsional motion driver member and torque bar, orientated tangential to rotation of the torsional motion driver member 550 and the torsional motion follower member 535.

Figure 6C:
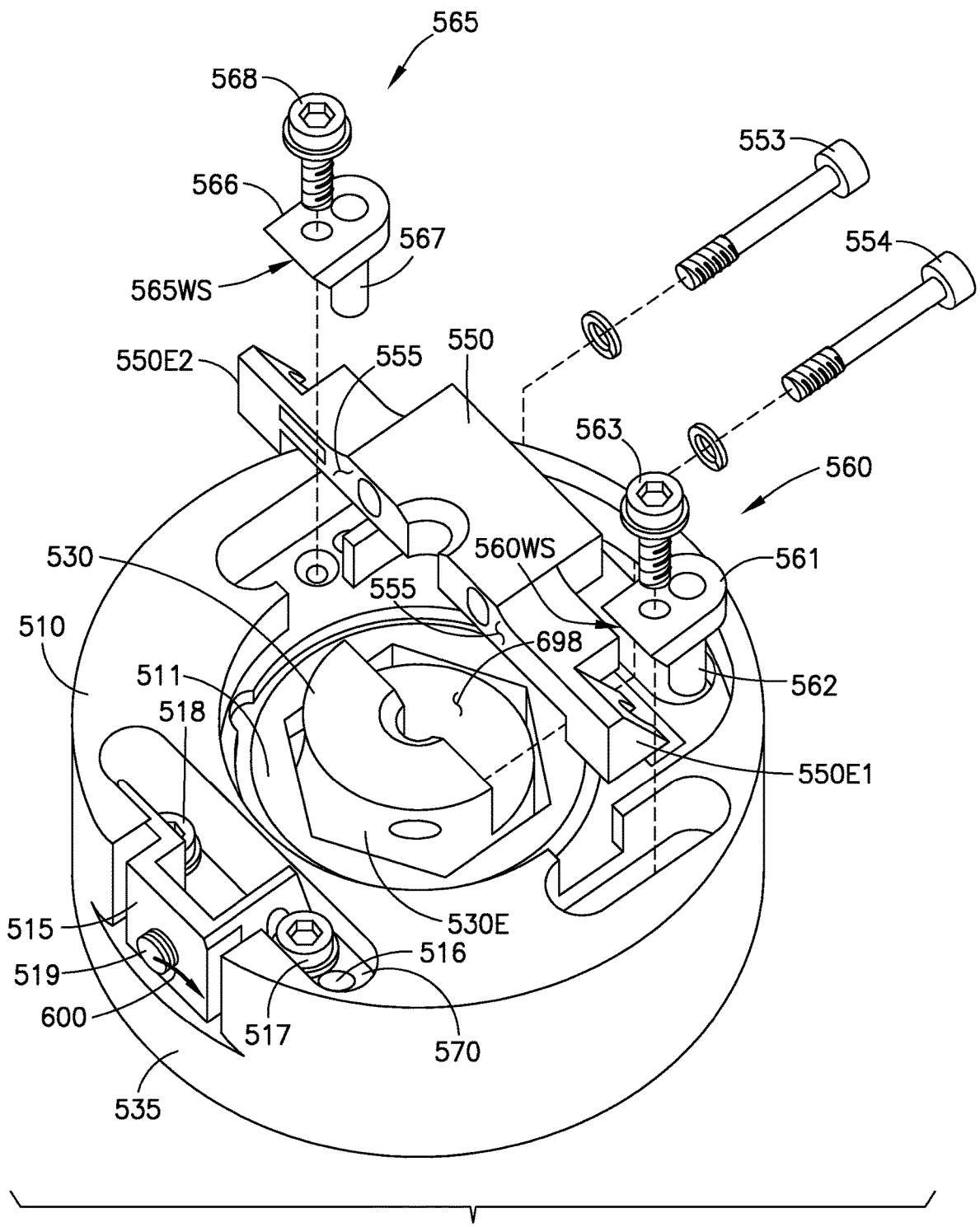
Figure 7:
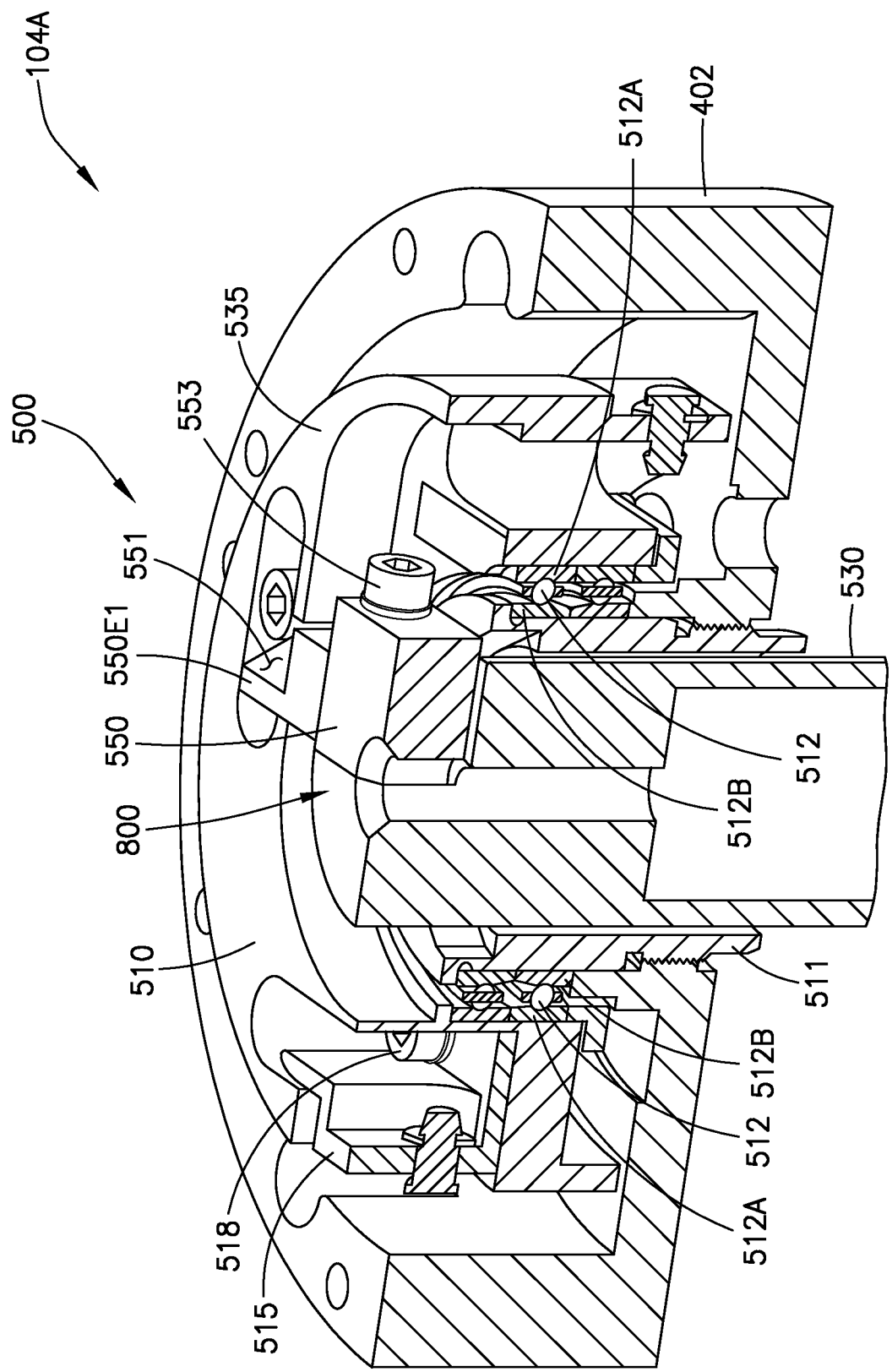
FIG. 7 is a cross section elevation schematic illustration of a portion of the substrate transport apparatus illustrated in FIG. 5 in accordance with aspects of the disclosed embodiment.
Figure 8:
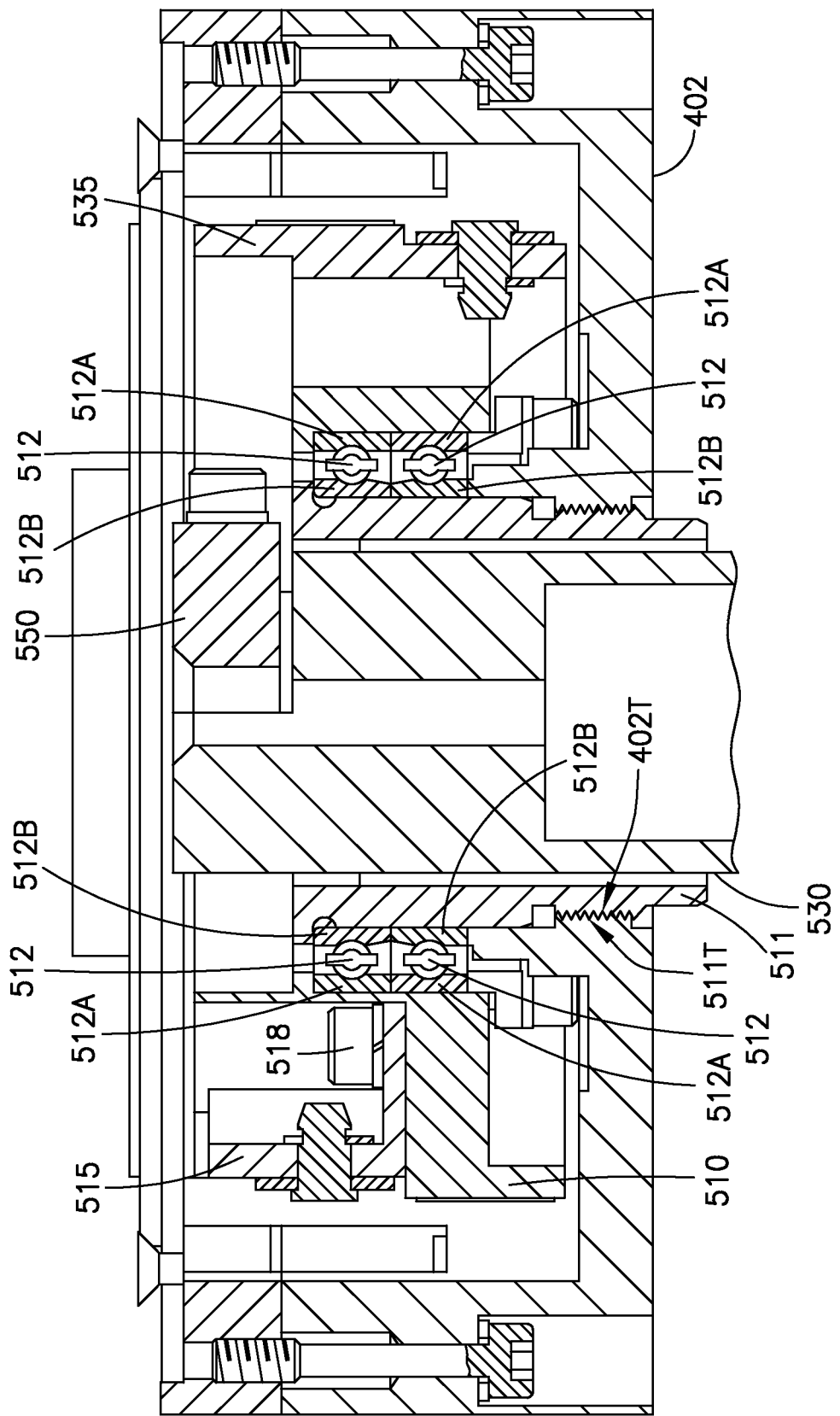
FIG. 8 is an enlarged partial cross section elevation schematic illustration of a portion of the substrate transport apparatus illustrated in FIG. 5 in accordance with aspects of the disclosed embodiment.

As seen best in FIGS. 6B and 6C, in one aspect, each of the first and second biasing members 560, 565 respectively includes a body 561, 566, a wedge engagement surface 560WS, 565WS, a pin 562, 567, and an attachment member 563, 568. The first and second biasing members 560, 565 are configured to engage a respective first and second end 550E1, 550E2 of the torque bar 550. More specifically, the wedge engagement surface 560WS, 565WS of the first and second biasing members 560, 565 are configured to engage a respective one of the first and second wedge surfaces 551, 552 of the torque bar 550, defining a pressure surface. The engagement between each biasing member 560, 565 and the respective first and second ends 550E1, 550E2 is configured to seat the torque bar 550 (and the dimensionally substantially invariant interface 500) seated on the driver member position datum surface 699, with respect to the follower member position datum surface 599. Although the aspects of the disclosed embodiment are described herein as having wedge surfaces, in other aspects, torque bar 550 may be seated in any suitable way, such as machining through a side of the torsional motion follower member as described below, or in any other suitable manner.

In one aspect, the pins 562, 567 are configured to pin (or locationally fix in place) each respective biasing member 560, 565 to the torsional motion follower member 535 so that torque loads 930 are transferred from the torsional motion driver member 530 to the torsional motion follower member 535 through the pins 562, 567 (e.g., the torque loads are reacted at the follower engagement surface 910 as shown in FIG. 9). As may be realized, biasing members define links, oriented along and by the wedge interface and preload (to fully rotate) at the pin coupling so that the biasing member is aligned rigidly with the dimensionally substantially invariant interface 500. The biasing members are configured to be simultaneously pinned to the torsional motion follower member 535 and engaged with the respective first and second ends 550E1, 550E2 of the torque bar 550 to transfer the torque loads 930 from the torsional motion driver member 530 through the torque bar 550 to the follower engagement surface 910 of the torsional motion follower member 535.

The attachment members 563, 568 may be substantially similar to the torque bar fastener members 553, 554 described above. The attachment members 563, 568 are configured to fasten and rigidly lock the respective first and second biasing member 560, 565 into position, substantially simultaneously engaging with the first and second ends 550E1, 550E2 of the torque bar 550, where the pins 562, 567 pin the respective first and second biasing member 563, 568 to the torsional motion follower member 535. The attachment members 563, 568 force engagement of the wedge engagement surface 560WS, 565WS of the first and second biasing members 563, 568 with the first and second wedge surfaces 551, 552 of the torque bar 550 so that the torque bar 550 is pushed/forced against the driver member position datum surface 699 and the follower member position datum surface 599. With the first and second biasing members 560, 565 fastened, a preload is applied to an end control surface 920 (FIG. 9) of each biasing member 560, 565 at each end 550E1, 550E2 of the torque bar 550. In one aspect, the attachment members 563, 568 are further configured to act like springs when fastened, such that any thermal growth variance is absorbed by the elasticity of the connection.

In one aspect, the first and second biasing members 560, 565, in a fastened position, remain substantially detached from the torsional motion follower member 535 (i.e., there is a gap GAP (FIG. 9) between each of the first and second biasing members 560, 565 and the body portion 510 of the torsional motion follower member 535). The biasing members 560, 565 maintaining a gap GAP between the body portion 510 of the torsional motion follower member 535 allows for a substantially non-friction transfer of torque from the torsional motion driver member 530 to the torsional motion follower member 535.

In one aspect, the torque bar 550 defines an end controlled thrust interface 900 at each of the first end 550E1 and the second end 550E2. Thrust or torque loads 930 are transferred from each of the end controlled thrust interfaces 900 to a respective follower engagement surface 910 of the torsional motion follower member 535. In one aspect, the thrust load transfer of torque from each of the end controlled thrust interfaces 900 to the respective follower engagement surface 910 is a substantially non-friction transfer. In one aspect, the end controlled thrust interfaces 900 are disposed to have a predetermined substantially constant location with respect to the torsional motion follower member 535 and the controlled distributed contact thrust interface 800 (FIG. 5). In one aspect, compression loads are transferred from the torsional motion driver member 530 to the thrust face 555 of the dimensionally substantially invariant interface 500 and from the end controlled thrust interface 900 of each of the first and second ends 550E1, 550E2 of the torque bar 550 to the torsional motion follower member 535 so as to effect transfer of the torsional motion and total torque from the torsional motion driver member 530 across the dimensionally substantially invariant interface 500 substantially with the compression loads decoupled from friction loads.

In one aspect, the torsional motion follower member 535 further includes a preloaded band to pulley coupling 515 connected to the torsional motion follower member 535. The preloaded band to pulley coupling 515 is configured to couple the drive bands 593 to the torsional motion follower member 535. The preloaded band to pulley coupling 515 includes an attachment member 518, a band attachment member 519 (FIG. 6C), and a biasing member 570 (FIG. 6C). The attachment member 518 is configured to couple the preloaded band to pulley coupling 515 to the body portion 510 of the torsional motion follower member 535. The band attachment member 519 is configured to attach the bands 593 to the preloaded band to pulley coupling 515. The biasing member 570 is substantially similar to the first and second biasing members 560, 565 described above and includes an attachment member 517 and a pin 516 to pin the preloaded band to pulley coupling 515 to the body portion 510 of the torsional motion follower member 535 substantially similar to the pins 562, 567 described above. The biasing member 570 is configured such that thrust loads 600 from the bands 593 are reacted by the torsional motion follower member 535 at the pin 516 substantially similar as described above.

In another example, referring to FIGS. 10, 11, and 12A-12B, a torsional motion follower member 535' (e.g., the upper arm 401) is coupled to a torsional motion driver member 530' (e.g., the outer drive shaft 410C) with dimensionally substantially invariant interface 500' to transfer torque from torsional motion driver member 530' to the torsional motion follower member 535'). The dimensionally substantially invariant interface 500' is substantially similar to the dimensionally substantially invariant interface 500 described above. In this aspect, the torsional motion driver member 530' has an exterior perimeter 530E' circumscribing the shoulder axis of rotation Z1 and a pass-through 1000 configured so that the middle and inner drive shafts 410B, 410A may pass through a center of the torsional motion driver member 530'. The torsional motion driver member 530' includes a driver member position datum surface 699'. The driver member position datum surface 699' defines, in part, the dimensionally substantially invariant interface 500' as will be further described below.

The upper arm 401 includes a body portion 510' and a bearing collar 511' rotatably coupled to the body portion 510' (FIG. 11) substantially similar to that described above with respect to the torsional motion follower member 535. The body portion 510' of the upper arm 401 includes a follower member position datum surface 599'. Substantially similar to the torsional motion driver member 530, the exterior perimeter 530E' of the torsional motion driver member 530' is a wholly free surface (i.e., the bearing collar 511' does not couple directly to the torsional motion driver member 530'. Additionally, the bearing collar 511' is also decoupled from the dimensionally substantially invariant interface 500'.

The driver member position datum surface 699' of the torsional motion driver member 530' and the follower member position datum surface 599' of the body portion 510' of the upper arm 401 are disposed in a predetermined alignment which sets a predetermined position of the torsional motion driver member 530' and the upper arm 401 with respect to each other. The dimensionally substantially invariant interface 500' has a configuration that complements the driver member position datum surface 699' of the torsional motion driver member 530' and the follower member position datum surface 599' of the upper arm 401 and effects a repeatable predetermined concentric position of the dimensionally substantially invariant interface 500' with respect to both the upper arm 401 and the torsional motion driver member 530'.

Still referring to FIGS. 10, 11, and 12A-12B, the torque bar 550' includes a first end 550E1', a second end 550E2', a thrust face 555' disposed between the first and second ends 550E1', 550E2', and torque bar attachment member 553', 554'. Substantially similar to the torque bar 550 described above, the torque bar 550' is configured to couple to the torsional motion driver member 530' via the torque bar attachment members 553', 554' to preload the torque bar with respect to the torsional motion driver member 530'. The torque bar 550' is further configured to couple to the upper arm 401, thereby effecting coupling of the upper arm 401 to the torsional motion driver member 530'. In this aspect, the torque bar 550' defines a portion of the pass-through 1000 when the torque bar 550' is coupled to the torsional motion driver member 530'.

In one aspect, the torque bar 550' defines, in part, the dimensionally substantially invariant interface 500'. For example, in one aspect, the dimensionally substantially invariant interface 500' is disposed on the torque bar 550' and engages simultaneously the torsional motion driver member 530' and the upper arm 401. This engagement of the torque bar 550' with the torsional motion driver member 530' and the upper arm 401, simultaneously, effects the transfer of torsion from the torsional motion driver member 530' to the upper arm 401. In one aspect, the thrust face 555' of the torque bar 550' is configured to engage the driver member position datum surface 699' of the torsional motion driver member 530' and defines at least part of the dimensionally substantially invariant interface 500'. The thrust face 555' engagement with the driver member position datum surface 699' defines a controlled distributed contact thrust interface 800' configured to distribute, from the torsional motion driver member 530', a substantially uniform thrust load across a face of the dimensionally substantially invariant interface 500' to the torque bar 550'.

Figure 12B:
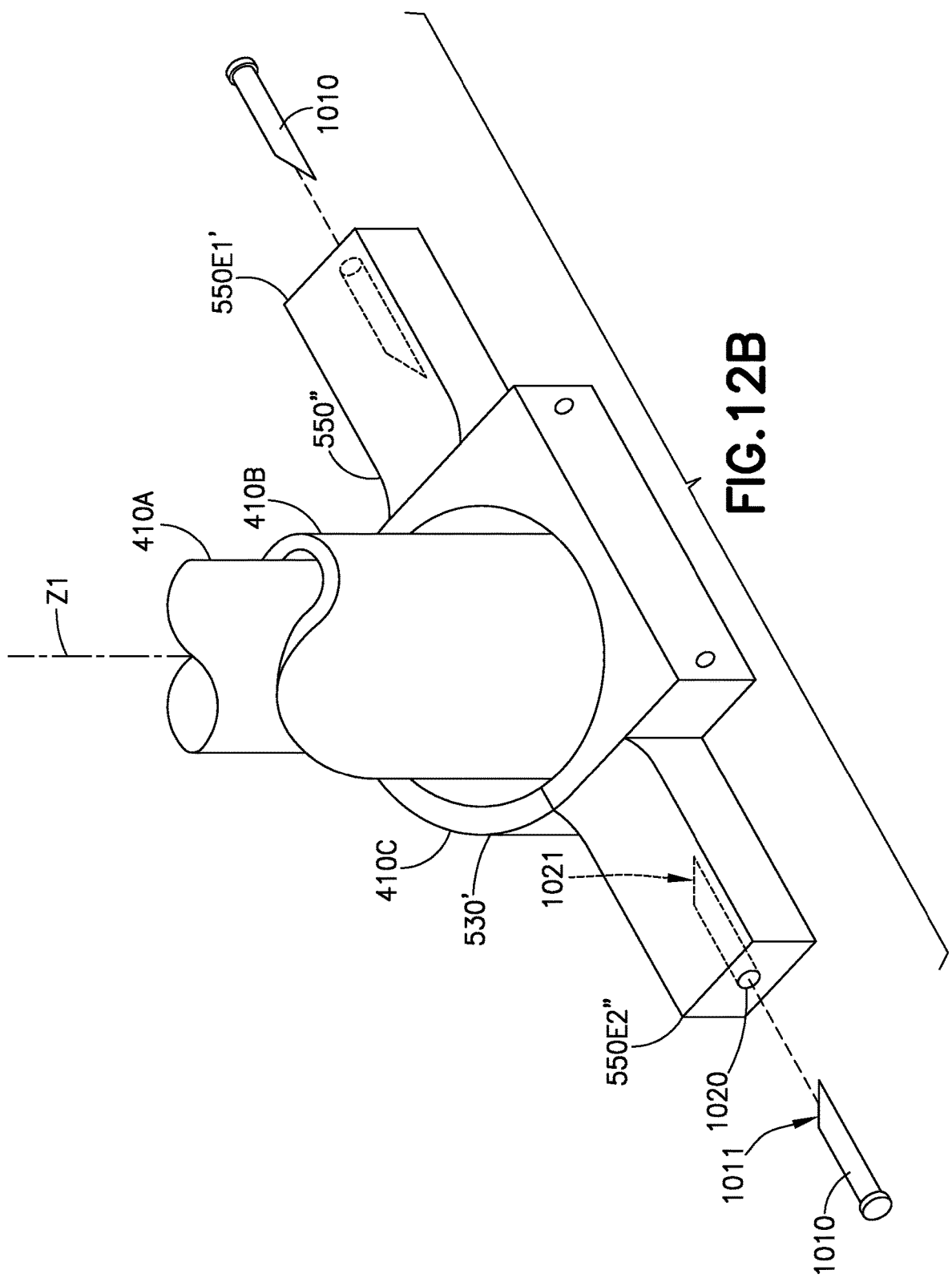

The first and second biasing members 560', 565' may operate substantially similar to the biasing members 560, 565 described above. In another aspect, as illustrated in FIG. 12B, torque bar 550" may be pinned to the upper arm 401 through one or more sides 401S1, 401S2 of the upper arm 401. Pins 1010 are inserted into recessed bores 1020 at each end 550E1", 550E2" of the of the torque bar 550". A tapered surface 1021 within the recessed bores 1020 is configured to interface with a tapered surface 1011 of the pins 1010 to position the torque bar 550" similar to that described above with respect to the biasing members 560, 565.

In one aspect, the torque bar 550' defines an end controlled thrust interface at each of the first end 550E1' and the second end 550E2'. Thrust loads are transferred from each of the end controlled thrust interfaces to a respective follower engagement surface of the upper arm 401. In one aspect, the thrust load transfer of torque from each of the end controlled thrust interfaces 900' to the respective follower engagement surface 910' is a substantially non-friction transfer. In one aspect, the end controlled thrust interfaces are disposed to have a predetermined substantially constant location with respect to the upper arm 401 and the controlled distributed contact thrust interface 800'.

In one aspect, compression loads are transferred from the torsional motion driver member 530' to the thrust face 555' of the dimensionally substantially invariant interface 500' and from the end controlled thrust interface of each of the first and second ends 550E1', 550E2' of the torque bar 550' to the upper arm 401 in a manner similar to that described above so as to effect transfer of the torsional motion and total torque from the torsional motion driver member 530' across the dimensionally substantially invariant interface 500' substantially with the compression loads decoupled from friction loads.

Figure 13:
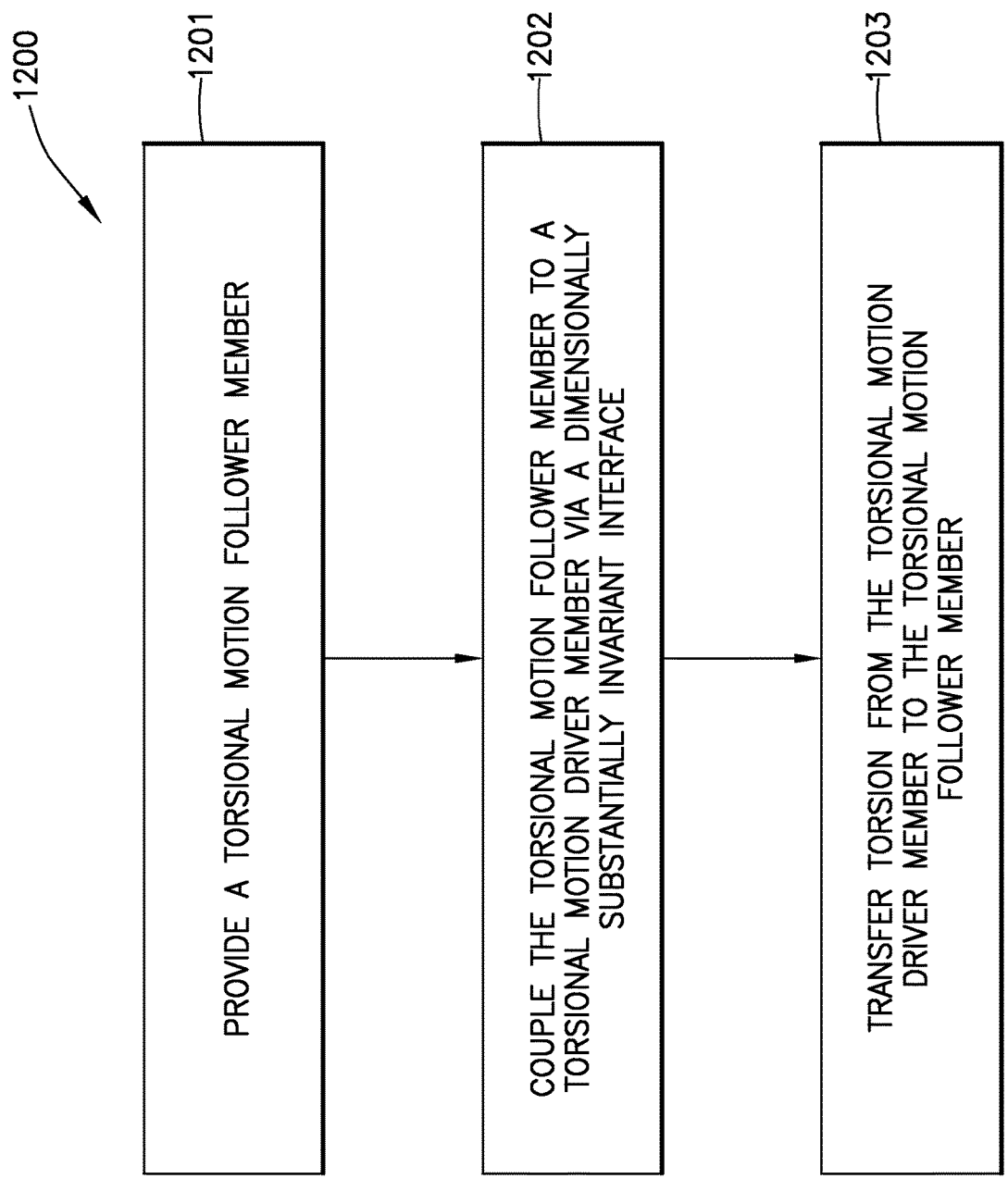
FIG. 13 is a flow chart of a method of operation of a substrate transport in accordance with one or more aspects of the disclosed embodiment.

Referring now to FIG. 13, an exemplary operation of the aspects of the disclosed embodiment will be described. In one aspect, the method 1300 includes providing a torsional motion follower member (FIG. 13, Block 1201), such as torsional motion follower member 535 including a bearing collar 511 and a body portion 510. The method further includes coupling the torsional motion follower member 535 to a torsional motion driver member, such as torsional motion driver member 530, via a dimensionally substantially invariant interface 500 (FIG. 13, Block 1202). The bearing collar 511 is decoupled from an exterior perimeter 410BE of the torsional motion driver member 530 so that the exterior perimeter 410BE, as a whole, is free of the bearing collar 511. The torsional motion driver member 530 is rotated by the second transmission 480 which is driven by the middle drive shaft 410B of the drive section 200'. Torque provided to the torsional motion driver member 530 by the second transmission 480 is transferred to the torsional motion follower member 535 via the dimensionally substantially invariant interface 500.

In one aspect, the method further includes coupling the torsional motion follower member 535 to the torsional motion driver member 530 with a torque bar 550. The torque bar 550 engages, simultaneously, the torsional motion driver member 530 and the torsional motion follower member 535 and effects transfer of torsion from the torsional motion driver member 530 to the torsional motion follower member 535 (FIG. 13, Block 1203). In one aspect, torque bar 550 defines an end controlled thrust interfaces 900 at each of a first end 550E1 and a second end 550E2. Thrust loads are transferred from each of the end controlled thrust interfaces 900 to a respective follower engagement surface 910 of the torsional motion follower member 535. In one aspect, the method further comprises transferring compression loads from the torsional motion driver member 530 to the thrust face 555 of the dimensionally substantially invariant interface 500 and from the end controlled thrust interface 900 of each of the first and second ends 550E1, 550E2 to the torsional motion follower member 535 so as to effect transfer of the torsional motion and total torque from the torsional motion driver member 530 across the dimensionally substantially invariant interface 500 substantially with the compression loads decoupled from friction loads.

In accordance with one or more aspects of the disclosed embodiments a substrate transport apparatus is provided. The substrate transport apparatus including a torsional motion driver member having an exterior perimeter circumscribing an axis of rotation of the torsional motion driver member, and a torsional motion follower member including a body portion and a bearing collar rotatably coupled to the body portion, the torsional motion follower member being coupled to the torsional motion driver member with a dimensionally substantially invariant interface, wherein the bearing collar is decoupled from the exterior perimeter of the torsional motion driver member so that the exterior perimeter, as a whole, is free of the bearing collar.

In accordance with one or more aspects of the disclosed embodiments the bearing collar is decoupled from an exterior perimeter surface orientated tangential to rotation of the torsional motion driver member and the torsional motion follower member, so that the exterior perimeter surface orientated tangential to rotation of the torsional motion driver member and the torsional motion follower member, as a whole, is free of the bearing collar.

In accordance with one or more aspects of the disclosed embodiments the bearing collar is decoupled from the dimensionally substantially invariant interface.

In accordance with one or more aspects of the disclosed embodiments the torsional motion driver member has a driver member position datum surface and the torsional motion follower member has a follower member position datum surface, wherein the driver member position datum surface and the follower member position datum surface are in a predetermined alignment setting a predetermined position of the torsional motion driver member and the torsional motion follower member with respect to each other.

In accordance with one or more aspects of the disclosed embodiments the dimensionally substantially invariant interface has a configuration that complements the driver member position datum surface of the torsional motion driver member and the follower member position datum surface of the torsional motion follower member so that engagement therewith by the dimensionally substantially invariant interface effects a repeatable predetermined position of the dimensionally substantially invariant interface with respect to both the torsional motion follower member and the torsional motion driver member.

In accordance with one or more aspects of the disclosed embodiments the repeatable predetermined position is a concentric position.

In accordance with one or more aspects of the disclosed embodiments a torque bar configured to couple the torsional motion follower member to the torsional motion driver member, wherein the dimensionally substantially invariant interface is disposed on the torque bar and engages simultaneously the torsional motion driver member and the torsional motion follower member and effects transfer of torsion from the torsional motion driver member to the torsional motion follower member.

In accordance with one or more aspects of the disclosed embodiments the torque bar includes a first end, a second end, and a thrust face disposed between the first and second ends, wherein the thrust face defines at least part of the dimensionally substantially invariant interface and is configured to engage the driver member position datum surface of the torsional motion driver member.

In accordance with one or more aspects of the disclosed embodiments the thrust face engagement with the driver member position datum surface defines a controlled distributed contact thrust interface configured to distribute, from the torsional motion driver member, a substantially uniform thrust load across a face of the dimensionally substantially invariant interface.

In accordance with one or more aspects of the disclosed embodiments the torque bar defines an end controlled thrust interface at each of the first end and the second end, wherein thrust loads are transferred from each of the end controlled thrust interfaces to a respective follower engagement surface of the torsional motion follower member.

In accordance with one or more aspects of the disclosed embodiments the thrust load transfer of torque from each of the end controlled thrust interfaces to the respective follower engagement surface is a substantially non-friction transfer.

In accordance with one or more aspects of the disclosed embodiments the end control thrust interfaces are disposed to have a predetermined substantially constant location with respect to the torsional motion follower member and the controlled distributed contact thrust interface.

In accordance with one or more aspects of the disclosed embodiments the first end includes a first wedge surface and the second end includes a second wedge surface, wherein the first and second wedge surfaces are configured to engage with a respective first and second biasing member to seat the dimensionally substantially invariant interface with respect to the follower member position datum surface and preload an end control surface of the biasing member.

In accordance with one or more aspects of the disclosed embodiments each of the first and second biasing member includes a wedge engagement surface to engage a respective one of the first and second wedge surfaces, wherein the engagement between each biasing member and the first and second ends seats and stiffens the biasing members.

In accordance with one or more aspects of the disclosed embodiments compression loads are transferred from the torsional motion driver member to the thrust face of the dimensionally substantially invariant interface and from the end control thrust interface of each of the first and second ends to the torsional motion follower member so as to effect transfer of the torsional motion and total torque from the torsional motion driver member across the dimensionally substantially invariant interface substantially with the compression loads decoupled from friction loads.

In accordance with one or more aspects of the disclosed embodiments each biasing member is pinned to the torsional motion follower member so that reaction loads are transferred to the torsional motion follower member through the pins.

In accordance with one or more aspects of the disclosed embodiments the dimensionally substantially invariant interface is a substantially frictionless coupling between the torsional motion follower member and the torsional motion driver member.

In accordance with one or more aspects of the disclosed embodiments the exterior perimeter of the torsional motion driver member is wholly a free surface.

In accordance with one or more aspects of the disclosed embodiments the torsional motion follower member is a pulley.

In accordance with one or more aspects of the disclosed embodiments a preloaded band to pulley coupling connected to the pulley.

In accordance with one or more aspects of the disclosed embodiments the torsional motion follower member is an arm link.

In accordance with one or more aspects of the disclosed embodiments the torsional motion driver member is a drive shaft.

In accordance with one or more aspects of the disclosed embodiments the torsional motion driver member is a drive shaft of a multi-axis drive spindle.

In accordance with one or more aspects of the disclosed embodiments the torsional motion driver member is one of an inner drive shaft or an outer drive shaft of a multi-axis drive spindle.

In accordance with one or more aspects of the disclosed embodiments an arm link housing, wherein the torsional motion follower member further comprises at least one bearing seating the body portion on the bearing collar, wherein bearing races of the at least one bearing depend from the arm link housing, independent of the torsional motion driver member.

In accordance with one or more aspects of the disclosed embodiments the bearing collar depends from the arm link housing independent of the torsional motion driver member.

In accordance with one or more aspects of the disclosed embodiments the torsional motion follower member comprises stainless steel.

In accordance with one or more aspects of the disclosed embodiments the torsional motion driver member comprises stainless steel.

In accordance with one or more aspects of the disclosed embodiments the bearing collar has a low thermal expansion coefficient.

In accordance with one or more aspects of the disclosed embodiments the bearing collar comprises a drive feature.

In accordance with one or more aspects of the disclosed embodiments the dimensionally substantially invariant interface is rigid and substantially invariant for each direction of the torque applied from the torsional motion driver member to the torsional motion follower member.

In accordance with one or more aspects of the disclosed embodiments the dimensionally substantially invariant interface is rigid and substantially invariant at a max torque in the applied direction and throughout torque transients, wherein the direction of applied torque is switched in an opposite applied direction to another max torque.

In accordance with one or more aspects of the disclosed embodiments the dimensionally substantially invariant interface is rigid and substantially invariant throughout the application of each torque transient between the max torque and the other max torque.

In accordance with one or more aspects of the disclosed embodiments a method is provided. The method including providing a torsional motion follower member including a bearing collar and a body portion, wherein the torsional motion follower member is coupled to a torsional motion driver member via a dimensionally substantially invariant interface, wherein the bearing collar is decoupled from an exterior perimeter of the torsional motion driver member so that the exterior perimeter, as a whole, is free of the bearing collar.

In accordance with one or more aspects of the disclosed embodiments the bearing collar is decoupled from the dimensionally substantially invariant interface.

In accordance with one or more aspects of the disclosed embodiments the torsional motion driver member has a driver member position datum surface and the torsional motion follower member has a follower member position datum surface, wherein the driver member position datum surface and the follower member position datum surface are in a predetermined alignment setting a predetermined position of the torsional motion driver member and the torsional motion follower member with respect to each other.

In accordance with one or more aspects of the disclosed embodiments the dimensionally substantially invariant interface has a configuration that complements the driver member position datum surface of the torsional motion driver member and the follower member position datum surface of the torsional motion follower member so that engagement therewith by the dimensionally substantially invariant interface effects a repeatable predetermined position of the dimensionally substantially invariant interface with respect to both the torsional motion follower member and the torsional motion driver member.

In accordance with one or more aspects of the disclosed embodiments the repeatable predetermined position is a concentric position.

In accordance with one or more aspects of the disclosed embodiments providing a torque bar configured to couple the torsional motion follower member to the torsional motion driver member, engaging simultaneously the torsional motion driver member and the torsional motion follower member with the dimensionally substantially invariant interface disposed on the torque bar and effecting transfer of torsion from the torsional motion driver member to the torsional motion follower member.

In accordance with one or more aspects of the disclosed embodiments the torque bar includes a first end, a second end, and a thrust face disposed between the first and second ends, wherein the thrust face defines at least part of the dimensionally substantially invariant interface, the method further comprising engaging the driver member position datum surface of the torsional motion driver member with the thrust face.

In accordance with one or more aspects of the disclosed embodiments engaging the thrust face with the driver member position datum surface defines a controlled distributed contact thrust interface configured to distribute, from the torsional motion driver member, a substantially uniform thrust load across a face of the dimensionally substantially invariant interface.

In accordance with one or more aspects of the disclosed embodiments the torque bar defines an end controlled thrust interface at each of the first end and the second end, the method further comprising transferring thrust loads from each of the end controlled thrust interfaces to a respective follower engagement surface of the torsional motion follower member.

In accordance with one or more aspects of the disclosed embodiments transferring the thrust loads from each of the end controlled thrust interfaces to the respective follower engagement surface is a substantially non-friction transfer.

In accordance with one or more aspects of the disclosed embodiments the end control thrust interfaces are disposed to have a predetermined substantially constant location with respect to the torsional motion follower member and the controlled distributed contact thrust interface.

In accordance with one or more aspects of the disclosed embodiments the first end includes a first wedge surface and the second end includes a second wedge surface, the method further comprising engaging the first and second wedge surfaces with a respective first and second biasing member to seat the dimensionally substantially invariant interface with respect to the follower member position datum surface and preload an end control surface of the biasing member.

In accordance with one or more aspects of the disclosed embodiments each of the first and second biasing member includes a wedge engagement surface to engage a respective one of the first and second wedge surfaces, wherein the engagement between each biasing member and the first and second ends seats and stiffens the biasing members.

In accordance with one or more aspects of the disclosed embodiments transferring compression loads from the torsional motion driver member to the thrust face of the dimensionally substantially invariant interface and from the end control thrust interface of each of the first and second ends to the torsional motion follower member so as to effect transfer of the torsional motion and total torque from the torsional motion driver member across the dimensionally substantially invariant interface substantially with the compression loads decoupled from friction loads.

In accordance with one or more aspects of the disclosed embodiments pinning each biasing member to the torsional motion follower member, and transferring reaction loads to the torsional motion follower member through the pins.

In accordance with one or more aspects of the disclosed embodiments the dimensionally substantially invariant interface is a substantially frictionless coupling between the torsional motion follower member and the torsional motion driver member.

In accordance with one or more aspects of the disclosed embodiments the exterior perimeter of the torsional motion driver member is wholly a free surface.

In accordance with one or more aspects of the disclosed embodiments the torsional motion follower member is a pulley.

In accordance with one or more aspects of the disclosed embodiments a preloaded band to pulley coupling connected to the pulley.

In accordance with one or more aspects of the disclosed embodiments the torsional motion follower member is an arm link.

In accordance with one or more aspects of the disclosed embodiments the torsional motion driver member is a drive shaft.

In accordance with one or more aspects of the disclosed embodiments the torsional motion driver member is a drive shaft of a multi-axis drive spindle.

In accordance with one or more aspects of the disclosed embodiments the torsional motion driver member is one of an inner drive shaft or an outer drive shaft of a multi-axis drive spindle.

In accordance with one or more aspects of the disclosed embodiments seating the body portion on the bearing collar with at least one bearing, wherein bearing races of the at least one bearing depend from an arm link housing, independent of the torsional motion driver member.

In accordance with one or more aspects of the disclosed embodiments the bearing collar depends from the arm link housing independent of the torsional motion driver member.

In accordance with one or more aspects of the disclosed embodiments the torsional motion follower member comprises stainless steel.

In accordance with one or more aspects of the disclosed embodiments the torsional motion driver member comprises stainless steel.

In accordance with one or more aspects of the disclosed embodiments the bearing collar has a low thermal expansion coefficient.

In accordance with one or more aspects of the disclosed embodiments the bearing collar comprises a drive feature.

In accordance with one or more aspects of the disclosed embodiments a substrate processing tool is provided. The substrate processing tool including a tool frame, and, a substrate transport connected to the tool frame and having a rotary drive member movably connected to so as to rotate relative to the tool frame and generate a torque, a rotary follower member connected to the rotary drive member so as to follow rotary drive member motion relative to the tool frame from the torque imparted from the rotary drive member to the rotary follower member, and a rotary torque transfer coupling with a contact torque transfer interface, between the rotary drive member and the rotary follower member, that is a rigid, substantially non-slip interface configured so the rigid, substantially non-slip interface has a predetermined repeatable bi-directional rigidity and substantially non-slip contact at the contact torque transfer interface so as to effect bi-directional torque transfer of the torque, from the rotary drive member across the rotary torque transfer coupling to the rotary follower member, via substantially non-friction transfer.

In accordance with one or more aspects of the disclosed embodiments the rotary follower member is located at least partially inside the rotary drive member, so that the rotary drive member is disposed around at least part of the rotary follower member.

In accordance with one or more aspects of the disclosed embodiments the rotary driver member is located at least partially inside the rotary follower member, so that the rotary follower member is disposed around at least part of the rotary drive member.

In accordance with one or more aspects of the disclosed embodiments the substrate transport apparatus is a high precision motion substrate transport apparatus.

In accordance with one or more aspects of the disclosed embodiments the high precision motion substrate transport apparatus has a high precision motion with a repeatability of motion of better than about 100 microns.

In accordance with one or more aspects of the disclosed embodiments the rotary drive member has a driver member position datum surface and the rotary follower member has a follower member position datum surface, wherein the driver member position datum surface and the follower member position datum surface are in a predetermined alignment setting a predetermined position of the rotary drive member and the rotary follower member with respect to each other.

In accordance with one or more aspects of the disclosed embodiments the contact torque transfer interface has a configuration that complements the driver member position datum surface of the rotary drive member and the follower member position datum surface of the rotary follower member so that engagement therewith by the contact torque transfer interface effects a repeatable predetermined position of the contact torque transfer interface with respect to both the rotary follower member and the rotary drive member.

In accordance with one or more aspects of the disclosed embodiments the repeatable predetermined position is a concentric position.

In accordance with one or more aspects of the disclosed embodiments the contact torque transfer interface engages simultaneously the rotary drive member and the rotary follower member and effects transfer of torsion from the rotary drive member to the rotary follower member.

In accordance with one or more aspects of the disclosed embodiments the rotary torque transfer coupling includes a first end, a second end, and a thrust face disposed between the first and second ends, wherein the thrust face defines at least part of the contact torque transfer interface and is configured to engage the driver member position datum surface of the rotary drive member.

In accordance with one or more aspects of the disclosed embodiments the thrust face engagement with the driver member position datum surface defines a controlled distributed contact thrust interface configured to distribute, from the rotary drive member, a substantially uniform thrust load across a face of the contact torque transfer interface.

In accordance with one or more aspects of the disclosed embodiments the rotary torque transfer coupling defines an end controlled thrust interface at each of the first end and the second end, wherein thrust loads are transferred from each of the end controlled thrust interfaces to a respective follower engagement surface of the rotary follower member.

In accordance with one or more aspects of the disclosed embodiments the thrust load transfer of torque from each of the end controlled thrust interfaces to the respective follower engagement surface is a substantially non-friction transfer.

In accordance with one or more aspects of the disclosed embodiments the end control thrust interfaces are disposed to have a predetermined substantially constant location with respect to the rotary follower member and the controlled distributed contact thrust interface.

In accordance with one or more aspects of the disclosed embodiments the first end includes a first wedge surface and the second end includes a second wedge surface, wherein the first and second wedge surfaces are configured to engage with a respective first and second biasing member to seat the rotary torque transfer coupling with respect to the follower member position datum surface and preload an end control surface of the biasing member.

In accordance with one or more aspects of the disclosed embodiments each of the first and second biasing member includes a wedge engagement surface to engage a respective one of the first and second wedge surfaces, wherein the engagement between each biasing member and the first and second ends seats and stiffens the biasing members.

In accordance with one or more aspects of the disclosed embodiments compression loads are transferred from the rotary drive member to the thrust face of the rotary torque transfer coupling and from the end control thrust interface of each of the first and second ends to the rotary follower member so as to effect transfer of the torsional motion and total torque from the rotary drive member across the contact torque transfer interface substantially with the compression loads decoupled from friction loads.

In accordance with one or more aspects of the disclosed embodiments each biasing member is pinned to the rotary follower member so that reaction loads are transferred to the rotary follower member through the pins.

In accordance with one or more aspects of the disclosed embodiments the exterior perimeter of the rotary drive member is wholly a free surface.

In accordance with one or more aspects of the disclosed embodiments the rotary follower member is a pulley.

In accordance with one or more aspects of the disclosed embodiments a preloaded band to pulley coupling connected to the pulley.

In accordance with one or more aspects of the disclosed embodiments the rotary follower member is an arm link.

In accordance with one or more aspects of the disclosed embodiments the rotary drive member is a drive shaft.

In accordance with one or more aspects of the disclosed embodiments the rotary drive member is a drive shaft of a multi-axis drive spindle.

In accordance with one or more aspects of the disclosed embodiments the rotary drive member is one of an inner drive shaft or an outer drive shaft of a multi-axis drive spindle.

In accordance with one or more aspects of the disclosed embodiments an arm link housing, wherein the rotary follower member further comprises at least one bearing seating the body portion on the bearing collar, wherein bearing races of the at least one bearing depend from the arm link housing, independent of the rotary drive member.

In accordance with one or more aspects of the disclosed embodiments the bearing collar depends from the arm link housing independent of the rotary drive member.

In accordance with one or more aspects of the disclosed embodiments the rotary follower member comprises stainless steel.

In accordance with one or more aspects of the disclosed embodiments the rotary drive member comprises stainless steel.

In accordance with one or more aspects of the disclosed embodiments the bearing collar has a low thermal expansion coefficient.

In accordance with one or more aspects of the disclosed embodiments the bearing collar comprises a drive feature.

In accordance with one or more aspects of the disclosed embodiments the contact torque transfer interface is rigid and substantially invariant for each direction of the torque applied from the torsional motion driver member to the torsional motion follower member.

In accordance with one or more aspects of the disclosed embodiments the contact torque transfer interface is rigid and substantially invariant at a max torque in the applied direction and throughout torque transients the direction of applied torque is switched in an opposite applied direction to another max torque.

In accordance with one or more aspects of the disclosed embodiments the contact torque transfer interface is rigid and substantially invariant throughout the application of each torque transient between the max torque and the other max torque.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
 a torsional motion driver member having an exterior perimeter circumscribing an axis of rotation of the torsional motion driver member; and
 a torsional motion follower member including a body portion and a bearing collar rotatably coupled to the body portion, the torsional motion follower member being coupled to the torsional motion driver member with a dimensionally substantially invariant interface, wherein the bearing collar is decoupled from the exterior perimeter of the torsional motion driver member so that the exterior perimeter, as a whole, is free of the bearing collar.

2. The substrate transport apparatus of claim 1, wherein the bearing collar is decoupled from the dimensionally substantially invariant interface.

3. The substrate transport apparatus of claim 1, wherein the torsional motion driver member has a driver member position datum surface and the torsional motion follower member has a follower member position datum surface, wherein the driver member position datum surface and the follower member position datum surface are in a predetermined alignment setting a predetermined position of the torsional motion driver member and the torsional motion follower member with respect to each other.

4. The substrate transport apparatus of claim 3, wherein the dimensionally substantially invariant interface has a configuration that complements the driver member position datum surface of the torsional motion driver member and the follower member position datum surface of the torsional motion follower member so that engagement therewith by the dimensionally substantially invariant interface effects a repeatable predetermined position of the dimensionally substantially invariant interface with respect to both the torsional motion follower member and the torsional motion driver member.

5. The substrate transport apparatus of claim 3, further comprising a torque bar configured to couple the torsional motion follower member to the torsional motion driver member, wherein the dimensionally substantially invariant interface is disposed on the torque bar and engages simultaneously the torsional motion driver member and the torsional motion follower member and effects transfer of torsion from the torsional motion driver member to the torsional motion follower member.

6. The substrate transport apparatus of claim 5, wherein the torque bar includes a first end, a second end, and a thrust face disposed between the first and second ends, wherein the thrust face defines at least part of the dimensionally substantially invariant interface and is configured to engage the driver member position datum surface of the torsional motion driver member.

7. The substrate transport apparatus of claim 6, wherein the first end includes a first wedge surface and the second end includes a second wedge surface, wherein the first and second wedge surfaces are configured to engage with a respective first and second biasing member to seat the dimensionally substantially invariant interface with respect to the follower member position datum surface and preload an end control surface of the biasing member.

8. The substrate transport apparatus of claim 1, wherein the dimensionally substantially invariant interface is a substantially frictionless coupling between the torsional motion follower member and the torsional motion driver member.

9. The substrate transport apparatus of claim 1, wherein the exterior perimeter of the torsional motion driver member is wholly a free surface.

10. The substrate transport apparatus of claim 9, further comprising a preloaded band to pulley coupling connected to the pulley.

11. The substrate transport apparatus of claim 1, wherein the torsional motion follower member is a pulley.

12. The substrate transport apparatus of claim 1, wherein the torsional motion follower member is an arm link.

13. The substrate transport apparatus of claim 1, wherein the torsional motion driver member is a drive shaft.

14. The substrate transport apparatus of claim 1, wherein the torsional motion driver member is a drive shaft of a multi-axis drive spindle.

15. The substrate transport apparatus of claim 1, wherein the torsional motion driver member is one of an inner drive shaft or an outer drive shaft of a multi-axis drive spindle.

16. The substrate transport apparatus of claim 1, further comprising an arm link housing, wherein the torsional motion follower member further comprises at least one bearing seating the body portion on the bearing collar, wherein bearing races of the at least one bearing depend from the arm link housing, independent of the torsional motion driver member.

17. The substrate transport apparatus of claim 16, wherein the bearing collar depends from the arm link housing independent of the torsional motion driver member.

18. The substrate transport apparatus of claim 1, wherein the dimensionally substantially invariant interface is rigid and substantially invariant for each direction of the torque applied from the torsional motion driver member to the torsional motion follower member.

19. The substrate transport apparatus of claim 18, wherein the dimensionally substantially invariant interface is rigid and substantially invariant at a max torque in the applied direction and throughout torque transients, wherein the direction of applied torque is switched in an opposite applied direction to another max torque.

20. A substrate transport apparatus comprising:
a torsional motion driver member having an exterior perimeter around an axis of rotation of the torsional motion driver member, and
a torsional motion follower member including a body portion and a bearing collar rotatably coupled to the body portion, the torsional motion follower member being coupled to the torsional motion driver member with a dimensionally substantially invariant interface, wherein the bearing collar is free from the exterior perimeter of the torsional motion driver member so that the exterior perimeter, as a whole, is released of the bearing collar.

21. A method comprising:
providing a torsional motion follower member including a bearing collar and a body portion;
wherein the torsional motion follower member is coupled to a torsional motion driver member via a dimensionally substantially invariant interface, wherein the bearing collar is decoupled from an exterior perimeter of the torsional motion driver member so that the exterior perimeter, as a whole, is free of the bearing collar.

22. The method of claim 21, wherein the bearing collar is decoupled from the dimensionally substantially invariant interface.

23. The method of claim 21, wherein the torsional motion driver member has a driver member position datum surface and the torsional motion follower member has a follower member position datum surface, wherein the driver member position datum surface and the follower member position datum surface are in a predetermined alignment setting a predetermined position of the torsional motion driver member and the torsional motion follower member with respect to each other.

24. The method of claim 23, wherein the dimensionally substantially invariant interface has a configuration that complements the driver member position datum surface of the torsional motion driver member and the follower member position datum surface of the torsional motion follower member so that engagement therewith by the dimensionally substantially invariant interface effects a repeatable predetermined position of the dimensionally substantially invariant interface with respect to both the torsional motion follower member and the torsional motion driver member.

25. The method of claim 23, further comprising providing a torque bar configured to couple the torsional motion follower member to the torsional motion driver member, engaging simultaneously the torsional motion driver member and the torsional motion follower member with the dimensionally substantially invariant interface disposed on the torque bar and effecting transfer of torsion from the torsional motion driver member to the torsional motion follower member.

26. The method of claim 21, wherein the dimensionally substantially invariant interface is a substantially frictionless coupling between the torsional motion follower member and the torsional motion driver member.

27. The method of claim 21, wherein the exterior perimeter of the torsional motion driver member is wholly a free surface.

28. The method of claim 21, further comprising seating the body portion on the bearing collar with at least one bearing, wherein bearing races of the at least one bearing depend from an arm link housing, independent of the torsional motion driver member.

* * * * *